United States Patent [19]
Tsukude

[11] Patent Number: 5,587,959
[45] Date of Patent: Dec. 24, 1996

[54] SEMICONDUCTOR MEMORY DEVICE

[75] Inventor: Masaki Tsukude, Itami, Japan

[73] Assignee: Mitsubishi Denki Kabushiki Kaisha, Tokyo, Japan

[21] Appl. No.: 530,583

[22] Filed: Sep. 19, 1995

[30] Foreign Application Priority Data

Jan. 10, 1995 [JP] Japan ................... 7-001920

[51] Int. Cl.$^6$ ................... G11C 8/00
[52] U.S. Cl. ................... 365/230.06; 365/230.03; 326/108
[58] Field of Search ................... 365/230.03, 230.06; 326/105, 106, 108

[56] References Cited

U.S. PATENT DOCUMENTS

| | | | |
|---|---|---|---|
| 4,542,486 | 9/1985 | Anami et al. | 365/230 |
| 4,958,326 | 9/1990 | Sakurai | 365/230.03 |
| 5,406,526 | 4/1995 | Sugibayashi | 365/230.03 |
| 5,416,748 | 5/1995 | Fujita | 365/230.06 |

OTHER PUBLICATIONS

NEC Technical Journal, vol. 47, No. 3, pp. 69–73, 1994, Y. MATSUI, et al., "Development of 64 M BIT DRAM".

*Primary Examiner*—David C. Nelms
*Assistant Examiner*—Son Mai
*Attorney, Agent, or Firm*—Oblon, Spivak, McClelland, Maier & Neustadt, P.C.

[57] ABSTRACT

It is an object to provide reduction of power consumption and/or speed-up of a semiconductor memory device. Different subdecode signals are supplied to respective blocks $BL_1$–$BL_m$ forming a memory cell array. The subdecode signals are generated in subdecode signal generating circuits $SDB1_1$–$SDB1_m$ provided corresponding to the respective blocks $BL_1$–$BL_m$ from addresses $BS_1$–$BS_m$ for block selection and addresses $SDA_1$, $SDA_2$ for subdecode signal provided respectively to the blocks. The subdecode signals are supplied only to subdecode circuits of one block specified by the address for block selection, and the number of subdecode circuits allotted to one subdecode signal generating circuit and the length of signal lines can be reduced.

16 Claims, 18 Drawing Sheets

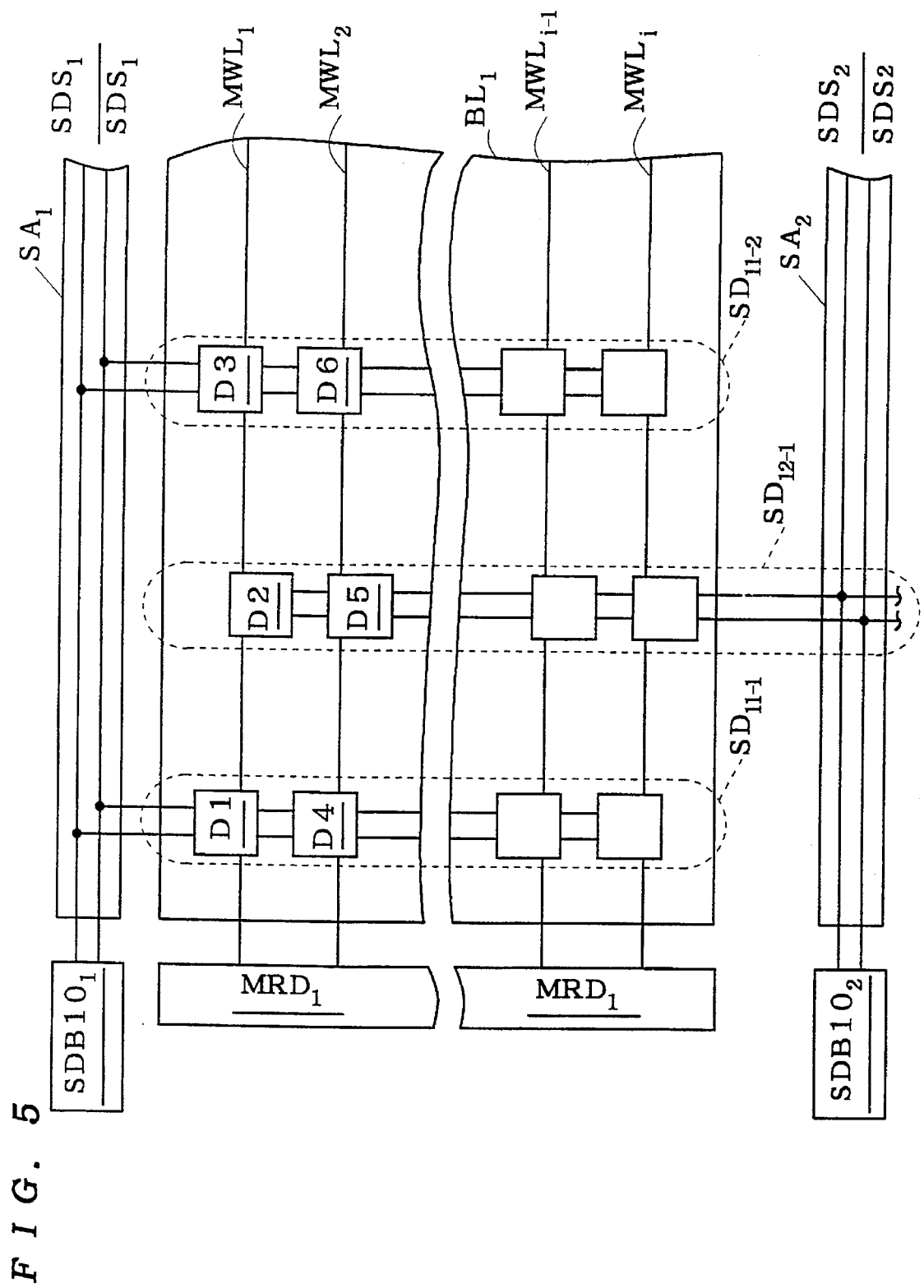
F I G. 5

SEMICONDUCTOR MEMORY DEVICE

BACKGROUND OF THE INVENTION

1. Field of the Invention

The present invention relates to semiconductor memory devices having main word lines and sub word lines and adopting the split decoder system in which decoding of selectively activating the word lines to select memory cells is done in two steps and, more particularly, to a semiconductor memory device in which a memory cell array is divided into a plurality of blocks and sense amplifier columns are provided for individual blocks.

2. Description of the Background Art

Conventionally, methods for reducing the rise time constant of word lines include the metal piling method in which word lines are backed with first aluminum interconnection layers, as an example. However, pitches of the first aluminum wirings become narrower as the devices are miniaturized more, increasing the possibility of reduction of yield, and now moderating the pitches of word lines is important technique.

Now, the split decoder system described in the *NEC Technical Journal* Vol.47 No.3/1994, pp.69–73 is an example for realizing it, where the drivers of word lines are divided to make the rise time constant of word lines smaller.

In this system, sub word lines are selected by main word lines selectively activated by main row decoders (referred to as MRD, hereinafter) and decoded subdecode signals. For example, the main word lines are provided using first metal interconnections, signal lines for transmitting subdecode signals are provided using second metal interconnections, for example, and the sub word lines are provided using transistor gate interconnections. The sub word lines are connected to driving circuits for driving the sub word lines according to states of the main word lines and the subdecode signals. Separating into decoders for driving the main word lines and driving circuits for driving the sub word lines allows load distribution of word lines, which allows the word lines to rise at high speed. Furthermore, as compared with the metal piling method, pitches of the first metal interconnections can be larger as the number of ways of the subdecode signals increases. Now, the number of ways corresponds to the number of rows of a memory cell array allotted to all the sub word lines provided corresponding to one main word line.

In the dynamic random access memories (referred to as DRAM, hereinafter), since more electricity is consumed as the number of memory cells increases, a memory cell array may be divided into a plurality of blocks and sense amplifiers may be provided for each of the blocks so that the read operation can be effected only to a required block.

FIG. 16 and FIG. 17 show an example of possible configuration where the conventional split decoder system is applied to the conventional DRAM with its memory cell array divided into a plurality of blocks. FIG. 16 is a block diagram showing important parts of a DRAM with a memory cell array divided into a plurality of blocks. In the figure, $BL_1$–$BL_m$ denote blocks including a plurality of memory cells arranged in rows and columns and forming a memory cell array, $MRD_1$–$MRD_m$ denote main row decoders provided corresponding respectively to the blocks $BL_1$–$BL_m$ of the memory cell array, $SA_1$–$SA_m$ denote sense amplifier columns provided corresponding respectively to the blocks $BL_1$–$BL_m$, $Bu_{101}$ denotes a buffer for preventing undesirable electrical interaction between a circuit for generating a subdecode signal $SDA_1$ and subdecode circuits, $Bu_{102}$ denotes a buffer for preventing undesirable electrical interaction between a circuit generating a subdecode signal $\overline{SDA_1}$, which is a complementary signal of the subdecode signal $SDA_1$, and subdecode circuits, $Bu_{103}$ denotes a buffer for preventing undesirable electric interaction between a circuit generating a subdecode signal $SDA_2$ and subdecode circuits, $Bu_{104}$ denotes a buffer for preventing undesirable electrical interaction between a circuit generating a subdecode signal $\overline{SDA_2}$, which is a complementary signal of the subdecode signal $SDA_2$, and subdecode circuits, 201–204 denote signal lines connected to outputs of the buffers $Bu_{101}$–$Bu_{104}$ and provided on the memory cell array to transmit the subdecode signals, 101 denotes a subdecode band formed of a plurality of subdecode circuits provided in an odd column of the block $BL_1$, 102 denotes a subdecode band formed of a plurality of subdecode circuits provided in an even column of the block $BL_1$, 111 denotes a subdecode band formed of a plurality of subdecode circuits provided in an odd column in the block $BL_2$, and 112 denotes a subdecode band formed of a plurality of subdecode circuits provided in an even column in the block $BL_2$.

The plurality of blocks $BL_1$–$BL_m$ are provided with a plurality of columns of subdecode bands, where the subdecode bands of odd columns of each block $BL_1$–$BL_m$ are supplied with the subdecode signals, $SDA_1$, $\overline{SDA_1}$ through the plurality of sets of buffers $Bu_{101}$, $Bu_{102}$, and the subdecode bands of even columns are provided with the subdecode signals $SDA_2$, $\overline{SDA_2}$ through the plurality of sets of buffers $Bu_{103}$, $Bu_{104}$. Accordingly, the subdecode bands of the same column in the respective blocks $BL_1$–$BL_m$ are simultaneously supplied with the same subdecode signals irrespective of a state of that block, a selected state or an unselected state.

FIG. 17 is a block diagram showing arrangement of the subdecode circuits in one of the plurality of blocks shown in FIG. 16. In FIG. 17, $MWL_1$–$MWL_m$ denote the first through m-th main word lines, $SWL_{1a}$–$SWL_{1b}$ denote sub word lines connected to some of the plurality of memory cells in the first row in the block $BL_1$, $SWL_{2a}$–$SWL_{2b}$ denote sub word lines connected to some of the plurality of memory cells in the second row in the block $BL_1$, D101 denotes a subdecode circuit connected to the main word line $MWL_1$ and the sub word line $SWL_{1a}$ and belonging to the subdecode band of the first column in the block $BL_1$, D102 denotes a subdecode circuit connected to the main word line $MWL_1$ and the sub word line $SWL_{2a}$ and belonging to the subdecode band of the second column in the block $BL_1$, D103 denotes a subdecode circuit connected to the main word line $MWL_1$ and the sub word line $SWL_{1b}$ and belonging to the subdecode band of the third column in the block $BL_1$, D104 denotes a subdecode circuit connected to the main word line $MWL_2$ and a sub word line corresponding to some of the memory cells in the third row in the block $BL_1$ and belonging to the subdecode band of the first column in the block $BL_1$, and the same reference characters as those in FIG. 16 denote the same parts as those designated by the same reference characters in FIG. 16.

Increasing the number of columns of the subdecode bands can shorten the length of a sub word line and reduce the number of memory cells for one subdecode circuit, but, on the other hand, it is disadvantageous in that the number of subdecode circuits increases to increase power consumption and the area for placement of the subdecode circuits.

The main word lines $MWL_1$–$MWL_m$ are disposed parallel to the sub word lines, that is, the transfer gates in the memory cells and the sub word lines are divided into n−1 relative to the main word line length in the main word line direction. The subdecode bands 101–104 are disposed in the boundaries of the division. On this subdecode band, signal lines 201–204 etc. for transmitting the subdecode signals $SDA_1$, $\overline{SDA_1}$, $SDA_2$, and $\overline{SDA_2}$ are provided perpendicular to the main word lines $MWL_1$–$MWL_m$. The subdecode circuits (referred to as SRD, hereinafter) are disposed at intersections of the main word lines and the subdecode signals. Detailed structure of the SRD is shown in FIG. 18. In FIG. 18, Q1 denotes a P-channel MOS transistor having one of its current electrodes supplied with the subdecode signal SDS and its other current electrode connected to the sub word line SWL and its control electrode connected to the main word line, Q2 denotes an N-channel MOS transistor having one of its current electrodes connected to the sub word line SWL, its control electrode connected to the main word line MWL and its other current electrode grounded, and Q3 denotes an N-channel MOS transistor having one of its current electrodes connected to the sub word line SWL, its control electrode supplied with the subdecode signal SDS and its other current electrode grounded. Operation of the subdecode circuit is shown in Table 1. In Table 1, $V_{PP}$ is a voltage higher than the voltage $V_{CC}$, and gnd is a ground voltage.

TABLE 1

|  | Stand-by | Selected Block | | | |
| --- | --- | --- | --- | --- | --- |
|  |  | MWL Active Portion | | MWL Inactive Portion | |
|  |  | Sub-decode Circuit Active | Subdecode Circuit Inactive | Subdecode Circuit Active | Subdecode Circuit Inactive |
| MWL | $V_{PP}$ | gnd | gnd | $V_{PP}$ | $V_{PP}$ |
| SDS | gnd | $V_{PP}$ | gnd | $V_{PP}$ | gnd |
| $\overline{SDS}$ | $V_{CC}$ | gnd | $V_{CC}$ | gnd | $V_{CC}$ |

The main word line MWL is supplied with the voltage gnd when activated and the voltage $V_{PP}$ when deactivated. When activated, the voltage $V_{PP}$ is provided as the subdecode signal SDS and the voltage gnd is provided as the subdecode signal $\overline{SDS}$, and when deactivated, the voltage gnd is provided as the subdecode signal SDS and the voltage $V_{CC}$ is provided as the subdecode signal $\overline{SDS}$. Accordingly, in standby, the main word line MWL is supplied with the voltage $V_{PP}$, the signal line is supplied with the voltage gnd as the subdecode signal SDS, and the signal line is supplied with the voltage $V_{CC}$ as the subdecode signal $\overline{SDS}$.

When the main word line MWL is activated, the ground voltage gnd is provided to the main word line, and the voltage $V_{PP}$ is provided as the subdecode signal SDS to one of the current electrodes of the transistor Q1 so as to activate the sub word line. Thus, the transistor Q1 attains an ON state and provides the voltage $V_{PP}$ to the sub word line SWL. Since the high voltage $V_{PP}$ is provided as the subdecode signal SDS when active, the power consumption of the buffer $Bu_{101}$, or the buffer $Bu_{103}$ outputting the subdecode signal SDS becomes larger as compared with the buffer $Bu_{102}$ or $Bu_{104}$ which outputs the voltage $V_{CC}$, as the subdecode signal $\overline{SDS}$ when it is inactive.

The voltage $V_{PP}$ must be applied to the main word line MWL in standby, but the action of decreasing the level of the voltage $V_{PP}$ caused by the leakage current from the main word line MWL becomes large, since a large number of main word lines MWL are provided in the memory cell array. Generally, the voltage $V_{PP}$ is obtained by raising the voltage $V_{CC}$. In such a case, a circuit which generates the voltage $V_{PP}$ operates to hold the level of the voltage $V_{PP}$ and increases the standby current. Also, after the standby state is held in a long time, and before the circuit generating the voltage $V_{PP}$ operates to supply the voltage $V_{PP}$ again, that is, when the subdecode signals SDS, $\overline{SDS}$ are activated with the voltage $V_{PP}$ having its level decreased, malfunction may occur.

In FIG. 16, the subdecode structure of the alternate arrangement type of two-way is shown to simplify the description. In this case, the two sub word lines $SWL_{1a}$, $SWL_{2a}$ are provided for the single main word line $MWL_1$, for example. Pitch of the single main word line formed of the first metal interconnection on the two sub word lines formed of gate polysilicon can be reduced to ½ in comparison with the metal piling method. As the subdecode signals are arranged in the alternate arrangement manner, subdecode circuits receiving the same subdecode signals only can be arranged for a single column of subdecode band.

In the DRAM as described above which is structured by combining conventional arts, all of the divided sub word lines for one column with respect to the main word line direction must be activated at the time when the signal on the main word line rises, for addresses are inputted by the time-division system. Hence, all the subdecode signals and subdecode circuits operate. Accordingly, there is a problem that the charge/discharge current of the subdecode signals and subdecode circuits increases to increase the power consumption as the sub word lines are divided into a larger number.

Furthermore, there is also a problem that the leakage current from the main word line increases when standby, increasing the power consumption.

SUMMARY OF THE INVENTION

According to a first aspect of the present invention, a semiconductor memory device comprises a memory cell array divided into a plurality of blocks including at least first and second blocks, having a plurality of memory elements arranged in a plurality of rows and a plurality of columns for dynamically storing information by storing charge and a plurality of main word lines and a plurality of sub word lines provided in each of the plurality of blocks and arranged parallel to the rows to select the memory elements, each of the plurality of blocks having first and second sides parallel to the rows and third and fourth sides parallel to the columns, a plurality of sense amplifier columns each provided corresponding to each of the plurality of blocks and arranged being the first side or the second side of the corresponding block, a plurality of main row decode means provided corresponding to each of the plurality of blocks, arranged on the side of the third side of the corresponding block, for selectively activating the plurality of main word lines in the corresponding block, a plurality of sub row decode means connected to the plurality of main word lines and the plurality of sub word lines and provided on the memory cell array, a plurality of selection signal lines arranged parallel to the first or second sides and connected to the plurality of sub row decode means for transmitting selection signals for activating the connected sub row decode means, and a plurality of selection signal generating means connected to the plurality of selection signal lines for generating the selection signals, the plurality of main word lines including at least a plurality of first main word lines provided in the first block and a plurality of second main word lines provided in the second block, the plurality of sub word lines including at least a plurality of first sub word lines and a plurality of second sub word lines provided corresponding to the plurality of first main word lines, and a plurality of third sub word lines and a plurality of fourth sub word lines provided corresponding to the second main word lines, the plurality of selection signal lines including at least a plurality of first selection signal lines and a plurality of second selection signal lines provided for the first block and a plurality of third selection signal lines and a plurality of fourth selection signal lines provided for the second block, the plurality of sub row decode means including at least a plurality of first sub row decode means provided on the first block and connected to the plurality of first main word lines, the plurality of first sub word lines and the plurality of first selection signal lines, a plurality of second sub row decode means provided on the first block, and connected to the plurality of first main word lines, the plurality of second sub word lines and the plurality of second selection signal lines, a plurality of third sub row decode means provided on the second block and connected to the plurality of second main word lines, the plurality of third sub word lines and the plurality of third selection signal lines and a plurality of fourth sub row decode means provided on the second block and connected to the plurality of second main word lines, the plurality of fourth sub word lines and the plurality of fourth selection signal lines, the plurality of selection signal generating means including at least first selection signal generating means provided corresponding to the first block, connected to the plurality of first selection signal lines, for generating and outputting a first selection signal, second selection signal generating means provided corresponding to the first block, connected to the plurality of second selection signal lines, for generating and outputting a second selection signal, third selection signal generating means provided corresponding to the second block, connected to the plurality of third selection signal lines, for generating and outputting a third selection signal, and fourth selection signal generating means provided corresponding to the second block, connected to the plurality of fourth selection signal lines, for generating and outputting a fourth selection signal, wherein when any one of the plurality of first main word lines is activated, the first and second sub word lines are simultaneously placed into an activatable state by the corresponding first and second sub row decode means, and then it is selected by activation of the first or second selection signals in the first block which of the first and the second sub word line is to be activated, and wherein when any one of the plurality of second main word lines is activated, the third and fourth sub word lines are simultaneously placed into an activatable state by the corresponding third and fourth sub row decode means, and then it is selected by the third and fourth selection signals in the second block which of the third and fourth sub word lines is to be activated.

Preferably, in a semiconductor memory device according to a second aspect of the present invention, the plurality of selection signal lines are provided on the plurality of sense amplifier columns.

Preferably, in a semiconductor memory device according to a third aspect of the present invention, the plurality of selection signal generating means are provided on the side of the third sides of the plurality of blocks.

Preferably, in a semiconductor memory device according to a fourth aspect of the present invention, the first and second blocks are provided adjacent to each other and share the second and third selection signal lines and the second and third selection signal generating means.

Preferably, in a semiconductor memory device according to a fifth aspect of the present invention, the plurality of selection signal generating means are provided on the side of the fourth sides of the plurality of blocks.

Preferably, in a semiconductor memory device according to a sixth aspect of the present invention, the plurality of selection signal lines are provided on the memory cell array.

Preferably, in a semiconductor memory device according to a seventh aspect of the present invention, the plurality of sub word lines further include a plurality of fifth sub word lines and a plurality of sixth sub word lines provided corresponding to the plurality of first main word lines, and a plurality of seventh sub word lines and a plurality of eighth sub word lines provided corresponding to the second main word lines, the plurality of selection signal lines further include a plurality of fifth selection signal lines and a plurality of sixth selection signal lines provided for the first block and a plurality of seventh selection signal lines and a plurality of eighth selection signal lines provided for the second block, the plurality of sub row decode means further include a plurality of fifth sub row decode means provided on the first block and connected to the plurality of first main word lines, the plurality of fifth sub word lines and the plurality of fifth selection signal lines, a plurality of sixth sub row decode means provided on the first block, and connected to the plurality of first main word lines, the plurality of sixth sub word lines and the plurality of sixth selection signal lines, a plurality of seventh sub row decode means provided on the second block and connected to the plurality of second main word lines, the plurality of seventh sub word lines and the plurality of seventh selection signal lines and a plurality of eighth sub row decode means provided on the second block and connected to the plurality of second main word lines, the plurality of eighth sub word lines and the plurality of eighth selection signal lines, the plurality of selection signal generating means further include fifth selection signal generating means provided corresponding to the first block, connected to the plurality of fifth selection signal lines, for generating and outputting a fifth selection signal which is equivalent to the first selection signal, sixth selection signal generating means provided corresponding to the first block, connected to the plurality of sixth selection signal lines, for generating and outputting a sixth selection signal which is equivalent to the second selection signal, seventh selection signal generating means provided corresponding to the second block, connected to the plurality of seventh selection signal lines, for generating and outputting a seventh selection signal which is equivalent to the third selection signal, and eighth selection signal generating means provided corresponding to the second block, connected to the plurality of eighth selection signal lines, for generating and outputting an eighth selection signal which is equivalent to the fourth selection signal, wherein when any one of the plurality of first main word lines is activated, the first and second sub word lines and the fifth and sixth sub word lines are simultaneously placed into an activatable state by the corresponding first and second sub row decode means and the fifth and sixth sub row decode means, and then it is selected by the first and second selection signals and the fifth and sixth selection signals in the first block which set of the first and fifth sub word lines and the second and sixth sub word lines is to be activated, and wherein when any one of the plurality of second main word lines is activated, the third and fourth sub word lines and the seventh and eighth sub word lines are simultaneously placed into an activatable state by the corresponding third and fourth sub row decode means and the seventh and eighth sub row decode means, and then it is selected by the third and fourth selection signals and the seventh and eighth selection signals in the second block which set of the third and seventh sub word lines and the fourth and eighth sub word lines is to be activated.

Preferably, in a semiconductor memory device according to an eighth aspect of the present invention, the first through fourth selection signal generating means are provided on the side of the third sides of the respective first and second blocks, and the fifth through eighth selection signal generating means are provided on the side of the fourth sides of the respective first and second blocks.

Preferably, in a semiconductor memory device according to a ninth aspect of the present invention, the plurality of selection signal generating means are provided on the side of the third sides of the plurality of blocks.

Preferably, in a semiconductor memory device according to a tenth aspect of the present invention, the plurality of sub word lines further include a plurality of fifth sub word lines and a plurality of sixth sub word lines provided corresponding to the plurality of first main word lines, and a plurality of seventh sub word lines and a plurality of eighth sub word lines provided corresponding to the second main word lines, the plurality of selection signal lines further include a plurality of fifth selection signal lines and a plurality of sixth selection signal lines provided for the first block and a plurality of seventh selection signal lines and a plurality of eighth selection signal lines provided for the second block, the plurality of sub row decode means further include a plurality of fifth sub row decode means provided on the first block and connected to the plurality of first main word lines, the plurality of fifth sub word lines and the plurality of fifth selection signal lines, a plurality of sixth sub row decode means provided on the first block, and connected to the plurality of first main word lines, the plurality of sixth sub word lines and the plurality of sixth selection signal lines, a plurality of seventh sub row decode means provided on the second block and connected to the plurality of second main word lines, the plurality of seventh sub word lines and the plurality of seventh selection signal lines and a plurality of eighth sub row decode means provided on the second block and connected to the plurality of second main word lines, the plurality of eighth sub word lines and the plurality of eighth selection signal lines, the plurality of selection signal generating means further include fifth selection signal generating means provided corresponding to the first block, connected to the plurality of fifth selection signal lines, for generating and outputting a fifth selection signal, sixth selection signal generating means provided corresponding to the first block, connected to the plurality of sixth selection signal lines, for generating and outputting a sixth selection signal, seventh selection signal generating means provided corresponding to the second block, connected to the plurality of seventh selection signal lines, for generating and outputting a seventh selection signal, eighth selection signal generating means provided corresponding to the second block, connected to the plurality of eighth selection signal lines, for generating and outputting an eighth selection signal, wherein when any one of the plurality of first main word lines is activated, the first and second sub word lines and the fifth and sixth sub word lines are simultaneously placed into an activatable state by the corresponding first and second sub row decode means and the fifth and sixth sub row decode means, and then it is selected by the first and second selection signals and the fifth and sixth selection signals in the first block which of the first, second, fifth and sixth sub word lines is to be activated, and wherein when any one of the plurality of second main word lines is activated, the third and fourth sub word lines and the seventh and eighth sub word lines are simultaneously placed into an activatable state by the corresponding third and fourth sub row decode means and the seventh and eighth sub row decode means, and then it is selected by the third and fourth selection signals and the seventh and eighth selection signals in the second block which of the third, fourth, seventh and eighth sub word lines is to be activated.

Preferably, in a semiconductor memory device according to an eleventh aspect of the present invention, the first through fourth selection signal generating means are provided on the side of the third sides of the first and second blocks, and the fifth though eighth selection signal generating means are provided on the side of the fourth sides of the first and second blocks.

In a twelfth aspect of the present invention, a semiconductor memory device comprises a plurality of memory elements provided in a plurality of rows and a plurality of columns for dynamically storing information by storing charge, a main word line supplied with one of a first voltage not to make a selection of a set of rows in which the plurality of memory elements are provided and a second voltage higher than the first voltage to make the selection, a first signal line for transmitting a binary first subdecode signal including the first voltage and a third voltage lower than the second voltage, a second signal line for transmitting a second subdecode signal having a logical value complementary to the first subdecode signal, a sub word line for selecting a certain row in the set of rows in accordance with an active state of the main word line and the first and second subdecode signals, a first MOS transistor of P-channel having a first current electrode connected to the main word line, a control electrode connected to the second signal line and a second current electrode connected to the sub word line, a second MOS transistor of N-channel having a first current electrode connected to the main word line, a control electrode connected to the first signal line and a second current electrode connected to the sub word line, and a third MOS transistor of N-channel having a first current electrode connected to the sub word line, a control electrode connected to the second signal line and a second current electrode connected to the first voltage.

Preferably, in a semiconductor memory device according to a thirteenth aspect of the present invention, a voltage on the high level side applied to the second signal line is selectively determined to one of the second voltage and the third voltage.

According to the semiconductor memory device of the first aspect, since the first through fourth selection signal lines supply the first and second selection signals and the third and forth selection signals to each of the first and second blocks, only the sub row decode means in one of the first and second blocks can be activated, for example, and the first through fourth selection signal generating means for driving the sub row decode means in unrequired blocks do not have to operate, therefor the power which was consumed in the sub row decode means which are now not driven by the first and fourth selection signal generating means can be saved.

The semiconductor memory device of the first aspect has the effect of raising the word lines at high speed with low power consumption because ones of the first through fourth selection signal lines and the first through fourth subdecode means which relate to a block with a selected main word line only are charged/discharged.

According to the semiconductor memory device of the second aspect of the present invention, the selection signal lines, which are provided on the sense amplifier columns, can be provided parallel to rows of the memory cell array, so that the interconnection distance can be shortened.

The semiconductor memory device of the second aspect has the effect of raising word lines at high speed with low power consumption because the interconnection distance can be reduced.

According to the semiconductor memory device of the third aspect of the present invention, since the first through fourth selection signal generating means are provided on the side of the fourth sides where no main decode means are provided, the degree of freedom in layout is large, which facilitates arrangement for easy production.

The semiconductor memory device of the third aspect has the effect of facilitating manufacturing since the degree of freedom in layout increases.

According to the semiconductor memory device of the fourth aspect of the present invention, making the second and third selection signals the same can make common the second selection signal line and the third selection signal line in the first through fourth selection signal lines, and make common the second and third selection signal generating means, reducing the number of selection signals, the number of selection signal lines and the number of selection signal generating means.

The semiconductor memory device of the fourth aspect has the effect of reducing the selection signals and the selection signal lines in number so as to simplify the device.

According to the semiconductor memory device of the fifth aspect of the present invention, the selection signal generating means are provided on the side of the third sides of blocks where the main row decode means are provided, so that they can be provided together with the main row decode means, which reduces the layout area of the semiconductor storage device.

The semiconductor memory device of the fifth aspect has the effect of facilitating miniaturization of the semiconductor memory device because the layout area of the semiconductor storage device can be reduced.

According to the semiconductor memory device of the sixth aspect of the present invention, as the first through fourth selection signal lines are provided on the first and second blocks, the layout area can be reduced in comparison with the case of providing these selection signal lines in other portions.

The semiconductor memory device of the sixth aspect has the effects of facilitating miniaturization of the device since the layout area can be reduced.

According to the semiconductor memory device of the seventh aspect of the present invention, in the first through fourth selection signal generating means and the fifth through eighth selection signal generating means, the fifth through eighth selection signal generating means for driving the fifth through eighth selection signals equivalent to the first through fourth selection signals are provided separately from the first through fourth selection signal generating means for driving the first through fourth selection signals, so that the number of subdecode means connected to a single selection signal line can be reduced and load for a single selection signal line can be reduced, thus reducing the rise time and fall time of the selection signals transmitted on the selection signal lines.

The semiconductor memory device of the seventh aspect has the effect of speeding up the operation of the device because the number of subdecode means driven by the selection signal generating means can be reduced and the rise and fall time of the selection signals transmitted on the selection signal lines can be reduced.

According to the semiconductor memory device of the eighth aspect of the present invention, as the first through fourth selection signal generating means and the fifth through eighth selection signal generating means are provided on both sides of the first and second blocks, the first through fourth selection signal lines and the fifth through eighth selection signal lines can be shortened, and the rise and fall time of the selection signals transmitted through the selection signal lines can be reduced.

The semiconductor memory device of the eighth aspect has the effect of speeding up the operation of the device because the first through eighth selection signal lines can be reduced in length and the rise and fall time of the selection signals transmitted on the selection signal lines can be shortened.

According to the semiconductor memory device of the ninth aspect of the present invention, as the selection signal generating means are all provided on the side of the third sides of the blocks, they can be provided together with the main row decode means, thus reducing the occupied area.

The semiconductor memory device of the ninth aspect has the effect of facilitating miniaturization of the device since the occupied area can be reduced.

According to the semiconductor memory device of the tenth aspect of the present invention, the first through eighth selection signals allow division of each of the first and second blocks also in the column direction, and only one of the first through fourth selection signal generating means and the fifth through eighth selection signal generating means operate, which produces the effect of reducing the consumption power.

According to the semiconductor memory device of the eleventh aspect of the present invention, as the first through fourth selection signal generating means and the fifth through eighth selection signal generating means are provided on both sides of the first and second blocks, the first through fourth selection signal lines and the fifth through eighth signal lines can be reduced in length, and the rise and fall time of the selection signals transmitted through the selection signal lines can be shortened.

The semiconductor memory device of the eleventh aspect has the effect of speeding up the operation of the device because the first through eighth selection signal lines can be shortened to shorten the rise and fall time of the selection signals transmitted on the selection signal lines.

According to the twelfth aspect of the present invention, the third MOS transistor goes into a non-conducting state when the first voltage is applied to the main word line and the first selection signal line is at the third voltage and the second MOS transistor goes into a conducting state at this time, and the first voltage is applied to the sub word line. When the second voltage is applied to the main word line and the first selection signal line is at the second voltage, the first MOS transistor goes into a conducting state and the third MOS transistor goes into a non-conducting state, and then the same voltage as the main word line is applied to the sub word line, and the sub word line is activated. When the second voltage is applied to the main word line and the first selection signal line is at the first voltage, the first and second transistors go into a non-conducting state and the third transistor goes into a conducting state, and then the first voltage is applied to the sub word line. The state in which the main word lines are at a low level can be used as a standby state.

The semiconductor memory device of the twelfth aspect has the effect of reducing the power consumption in standby because the state in which the main word lines are at a low level can be used as a standby state.

According to the semiconductor memory device of the thirteenth aspect of the present invention, as it is possible to selectively apply one of the second voltage and the third voltage lower than that to the second selection signal line as a high potential side voltage, using the third voltage, not the second voltage, when no high voltage is required can suppress leakage voltage so as to moderate lowering of voltage.

The semiconductor memory device of the thirteenth aspect has the effect of reducing the power consumption since the high potential side voltage can be controlled low as required.

The present invention has been made to solve such problems as mentioned earlier, and it is an object of the present invention to provide a semiconductor memory device of the split decoder system in which subdecode signals are not inputted from a direction normal to main word lines but inputted parallel to the main word lines, and signals previously decoded with signals for selecting blocks are used, so that only subdecode signals and subdecode circuits relating to a block with a selected main word line are charged/discharged and other subdecode circuits are prevented from being charged/discharged, and thus the word lines can be raised at high speed with low power consumption and pitch of first metal interconnection can be moderated. It is also an object of the present invention to obtain a semiconductor memory device with small power consumption in standby.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing arrangement of subdecode circuits in the memory cell array according to the second preferred embodiment of the present invention.

DESCRIPTION OF THE PREFERRED EMBODIMENTS

First Preferred Embodiment

Figure 1:
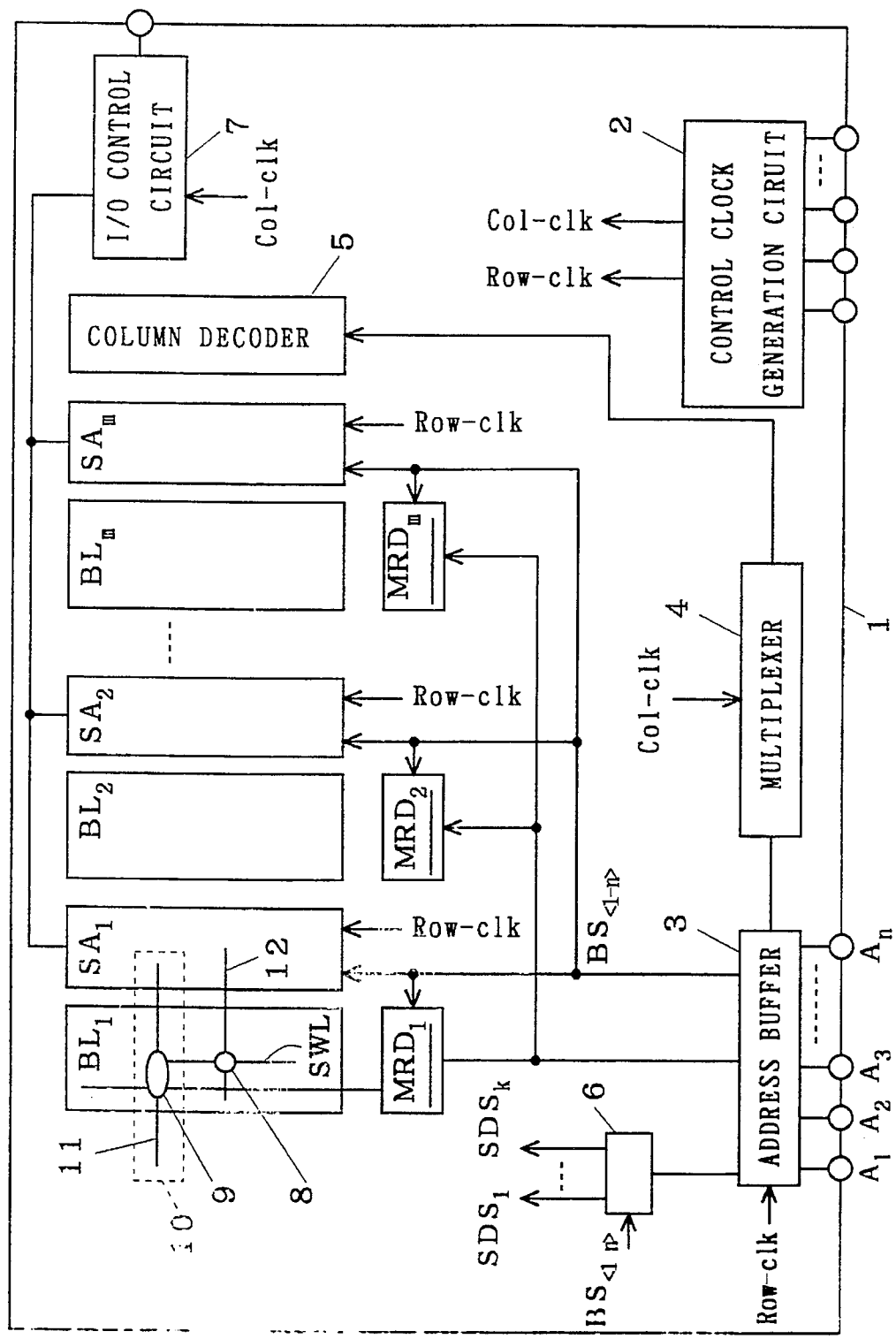
FIG. 1 is a block diagram showing an outline of the structure of a semiconductor memory device according to a first preferred embodiment of the present invention.

A semiconductor memory device according to a first preferred embodiment of the present invention will now be described referring to FIG. 1 through FIG. 3. FIG. 1 is a block diagram showing an outline of the structure of a semiconductor memory device according to the first preferred embodiment of the present invention. In FIG. 1, 1 denotes a semiconductor memory device having a memory cell array divided into a plurality of blocks, 2 denotes a control clock generating circuit for generating internal clocks Row-clk, Col-clk used in the semiconductor memory device according to control signals and clocks provided from the outside of the semiconductor memory device 1, 3 denotes an address buffer for distributing addresses $A_1$–$A_n$ inputted from the outside of the semiconductor memory device 1 to respective parts in the semiconductor memory device 1 in accordance with the clock Row-clk, 4 denotes a multiplexer for outputting column addresses in the addresses provided from the address buffer 3 in accordance with the clock Col-clk, 5 denotes a column decoder for decoding the addresses provided from the multiplexer 4, $BL_1$–$BL_m$ denote respective blocks forming the memory cell array, $MRD_1$–$MRD_m$ denote row decoders provided corresponding to the blocks $BL_1$–$BL_m$ for decoding the row addresses received from the address buffer 3, $SA_1$–$SA_m$ denote sense amplifier columns provided corresponding to the blocks $BL_1$–$BL_m$ and having a plurality of sense amplifiers arranged therein for reading information stored in the memory cells of corresponding blocks $BL_1$–$BL_m$ in accordance with addresses for block selection and the clock Row-clk, 6 denotes a subdecode signal generation circuit group for outputting individual subdecode signals $SDS_1$–$SDS_k$ to the blocks $BL_1$–$BL_m$ in accordance with the addresses for block selection BS and addresses for subdecode provided from the address buffer 3, and 7 denotes an Input/Output control circuit for outputting the signals outputted from the sense amplifiers $SA_1$–$SA_m$ in accordance with the Col-clk to the outside of the semiconductor memory device 1.

Furthermore, in FIG. 1, 8 denotes one of a plurality of memory cells provided in the block $BL_1$, MWL denotes a main word line corresponding to a certain set of rows to which the memory cell 8 belongs, SWL denotes a sub word line corresponding to the row in the sets of rows to which the memory cell 8 belongs, 9 denotes a decode circuit which determines active or inactive of the sub word line in accordance with the subdecode signals and a state of the main word line, 10 denotes a subdecode band which is a group of decode circuits in the same column as the decode circuit 9 in the decode circuits, 11 denotes a signal line for transmitting the subdecode signals to the decode circuits in the subdecode band 10, and 12 denotes a bit line connected to the memory cell 8.

The number of the subdecode signals $SDS_1$–$SDS_k$ generated in the subdecode signal generation circuit group 6 differ according as how many rows are allotted to a single main word line. For example, in the case of the 2-way split decoder system in which a single main word line takes two rows of memory cells, two kinds of subdecode signals are required for each of the blocks $BL_1$–$BL_m$, and 2×m kinds of subdecode signals are required in the entire memory cell array so that the subdecode signals differ for every block.

In such a semiconductor memory device with a memory cell array split into a plurality of blocks, only a selected block in the blocks $BL_1$–$BL_m$ is placed in an active state and other unselected blocks are placed in an inactive state to reduce the power consumption, so that addresses BS for block selection for selecting active or inactive of blocks are provided to the row decoders $MRD_1$–$MRD_m$ corresponding to the respective blocks.

Now, the subdecode signals $SDS_1$–$SDS_{2m}$ are generated by ANDing the address BS for block selection and an address for selecting whether an odd row or an even row in the block is to be selected, for example.

Next, the relation among the memory cell array, the subdecode signal generation circuit group 6, the main row decoders $MRD_1$–$MRD_m$ and the sense amplifier columns will be described referring to FIG. 2. FIG. 2 is a block diagram showing the structure of the memory cell array and periphery thereof when the 2-way split decoder system is used in the semiconductor memory device according to the first preferred embodiment of the present invention. In FIG. 2, $SDB1_1$–$SDB1_m$ denote subdecode signal generation circuits provided corresponding to the blocks $BL_1$–$BL_m$ and forming the subdecode signal generation circuit group 6 shown in FIG. 1 in the 2-way split decoder system, 20 denotes an AND gate for ANDing the address $SDA_1$ for subdecode signal and the address $BS_1$ for block selection, 21 denotes a NOT gate receiving output of the AND gate 20 for outputting a signal having a negative logical value, 22 denotes a buffer for transmitting the output of the AND gate 20, 23 denotes a buffer for transmitting the output of the NOT gate 21, 24 denotes an AND gate for ANDing the address $SDA_2$ for subdecode signal and the address $BS_1$ for block selection, 25 denotes a NOT gate receiving the output of the AND gate 24 for outputting a signal having negative logical value, 26 denotes a buffer for transmitting the output of the AND gate 24, 27 denotes a buffer for transmitting the output of the NOT gate 25, 31 denotes a signal line provided parallel to the rows of the block $BL_1$ on the sense amplifier column $SA_1$ for transmitting the subdecode signal $SDS_1$ outputted from the buffer 22, 32 denotes a signal line provided parallel to the rows of the block $BL_1$ on the sense amplifier column $SA_1$ for transmitting the subdecode signal $\overline{SDS_1}$ outputted from the buffer 23, 33 denotes a signal line provided parallel to the rows of the block $BL_1$ on the sense amplifier column $SA_1$ for transmitting the subdecode signal $SDS_2$ outputted from the buffer 26, 34 denotes a signal line provided parallel to the rows of the block $BL_1$ on the sense amplifier column $SA_1$ for transmitting the subdecode signal $\overline{SDS_2}$ outputted by the buffer 27, $SD_{1-1}$–$SD_{1-n}$ denote subdecode bands provided in n columns on the block $BL_1$, and $SD_{2-n}$–$SD_{2-n}$ denote subdecode bands provided in n columns on the block $BL_2$.

The circuit configuration of the subdecode signal generation circuits $SDB1_2$–$SDB1_m$ is the same as that of the subdecode signal generation circuit $SDB1_1$. They are different in that the block selecting addresses $BS_1$–$BS_m$ for corresponding blocks $BL_1$–$BL_m$ are provided. Subdecode signals with which subdecode circuits for a block selected by the block selecting addresses $BS_1$–$BS_m$ only will operate are generated in the respective subdecode signal generation circuits $SDB1_1$–$SDB1_m$.

In the conventional semiconductor memory device, as the subdecode signals are provided simultaneously to the subdecode circuits of all the blocks which belong to subdecode bands of odd columns or even columns, a large number of signal lines and decode circuits are driven at once, resulting in an increase of the charge/discharge current. As contrasted therewith, the semiconductor memory device according to the first preferred embodiment can reduce the power consumption since the subdecode signals are charged/discharged only for one block. Also, load for a single driving circuit for providing the subdecode signals is distributed and thus the rise and fall of the subdecode signals can be speeded up.

The subdecode signals $SDS_1$, $\overline{SDS_1}$ are provided to the odd-numbered subdecode bands $SD_{1-1}$, $SD_{1-3}$, $SD_{2-1}$, $SD_{2-3}$, etc. in the respective blocks $BL_1$–$BL_m$ through the signal lines 31, 32. The subdecode signals $SDS_2$, $\overline{SDS_2}$ are provided to the even-numbered subdecode bands $SD_{1-2}$, $SD_{1-4}$, $SD_{2-2}$, $SD_{2-4}$, etc. through the signal lines 33, 34.

The arrangement of the subdecode circuits provided in the blocks will be described. FIG. 3 is a block diagram showing the arrangement of the subdecode circuits in the block $BL_1$ in FIG. 2. In FIG. 3, D1–D6 denote subdecode circuits, $MWL_1$–$MWL_i$ denote main word lines and $SWL_{1a}$–$SWL_{3b}$ denote sub word lines. The subdecode circuits D1, D3 for controlling active or inactive of the sub word lines $SWL_{1a}$, $SWL_{1b}$, etc. connected to the memory cells in the first row in the block are connected to the main word line $MWL_1$ and receive the subdecode signals $SDS_1$, $\overline{SDS_1}$. The subdecode circuits D2 etc. for controlling active or inactive of the sub word lines $SWL_{2a}$, $SWL_{2b}$, etc. in the second row in the block are connected to the main word line $MWL_1$ and receive the subdecode signals $SDS_2$, $\overline{SDS_2}$.

When the main word line $MWL_1$ is activated, it is determined by the subdecode signals $SDS_1$, $\overline{SDS_1}$ and $SDS_2$, $\overline{SDS_2}$ provided to the odd subdecode bands $SD_{1-1}$, $SD_{1-3}$, etc. and the even subdecode bands $SD_{1-2}$ etc. whether the sub word lines $SWL_{1a}$, $SWL_{1b}$ etc. in the first row are activated, or the sub word lines $SWL_{2a}$, $SWL_{2b}$, etc. in the second row are activated.

Figure 2:
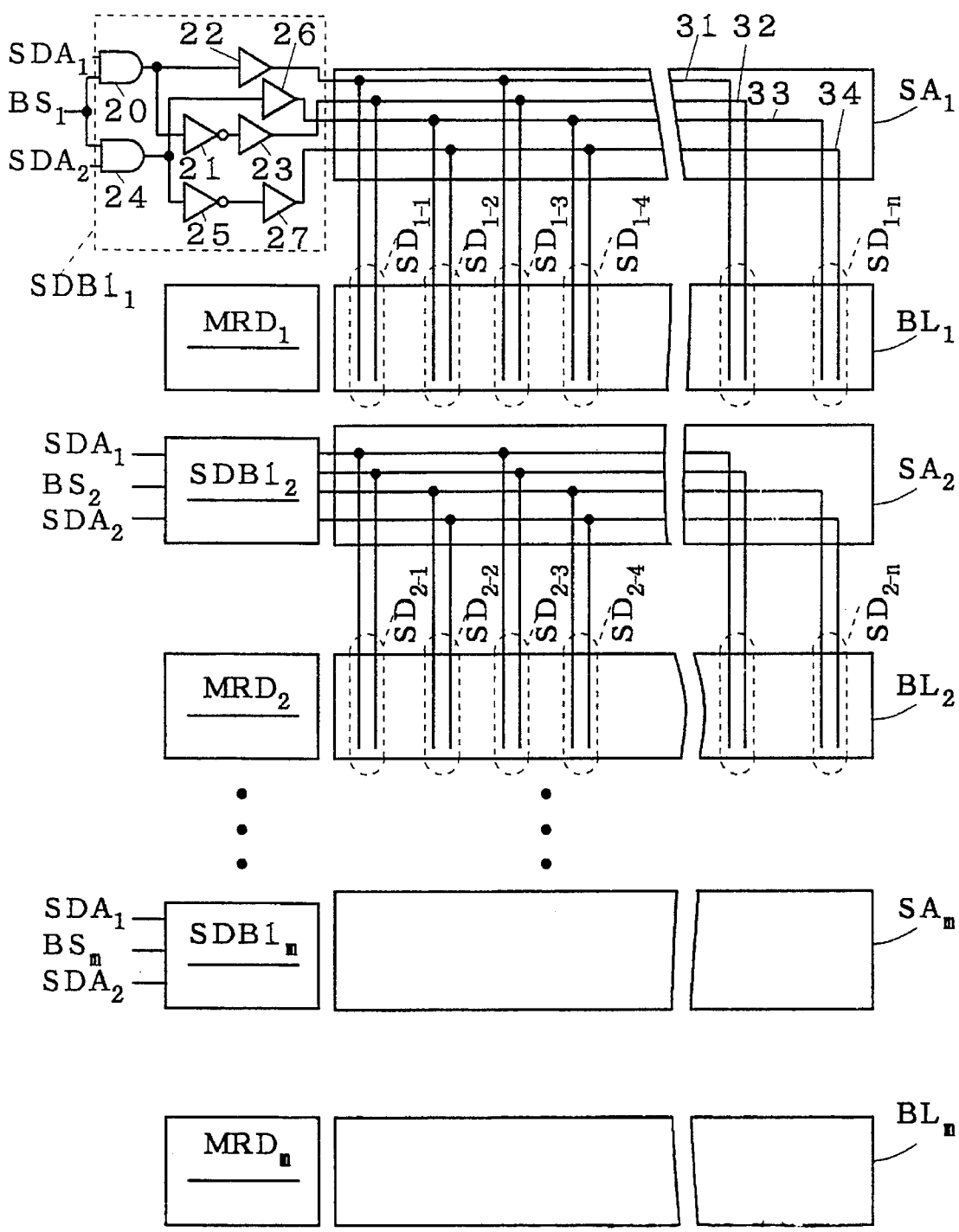
FIG. 2 is a block diagram showing arrangement of circuits in the periphery of the memory cell array of the semiconductor memory device according to the first preferred embodiment of the present invention.
Figure 3:
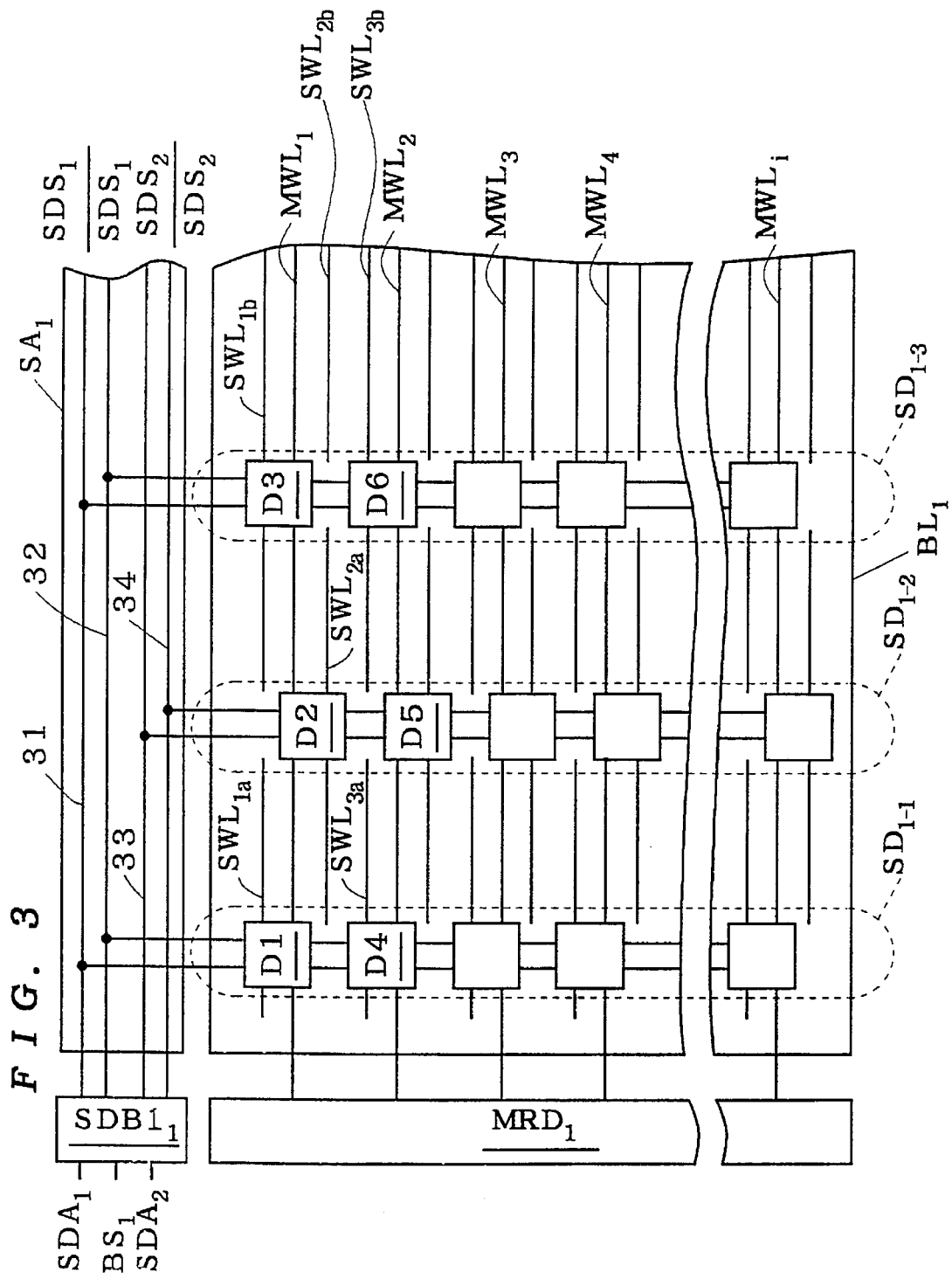
FIG. 3 is a block diagram showing arrangement of subdecode circuits in the memory cell array according to the first preferred embodiment of the present invention.
Figure 16:
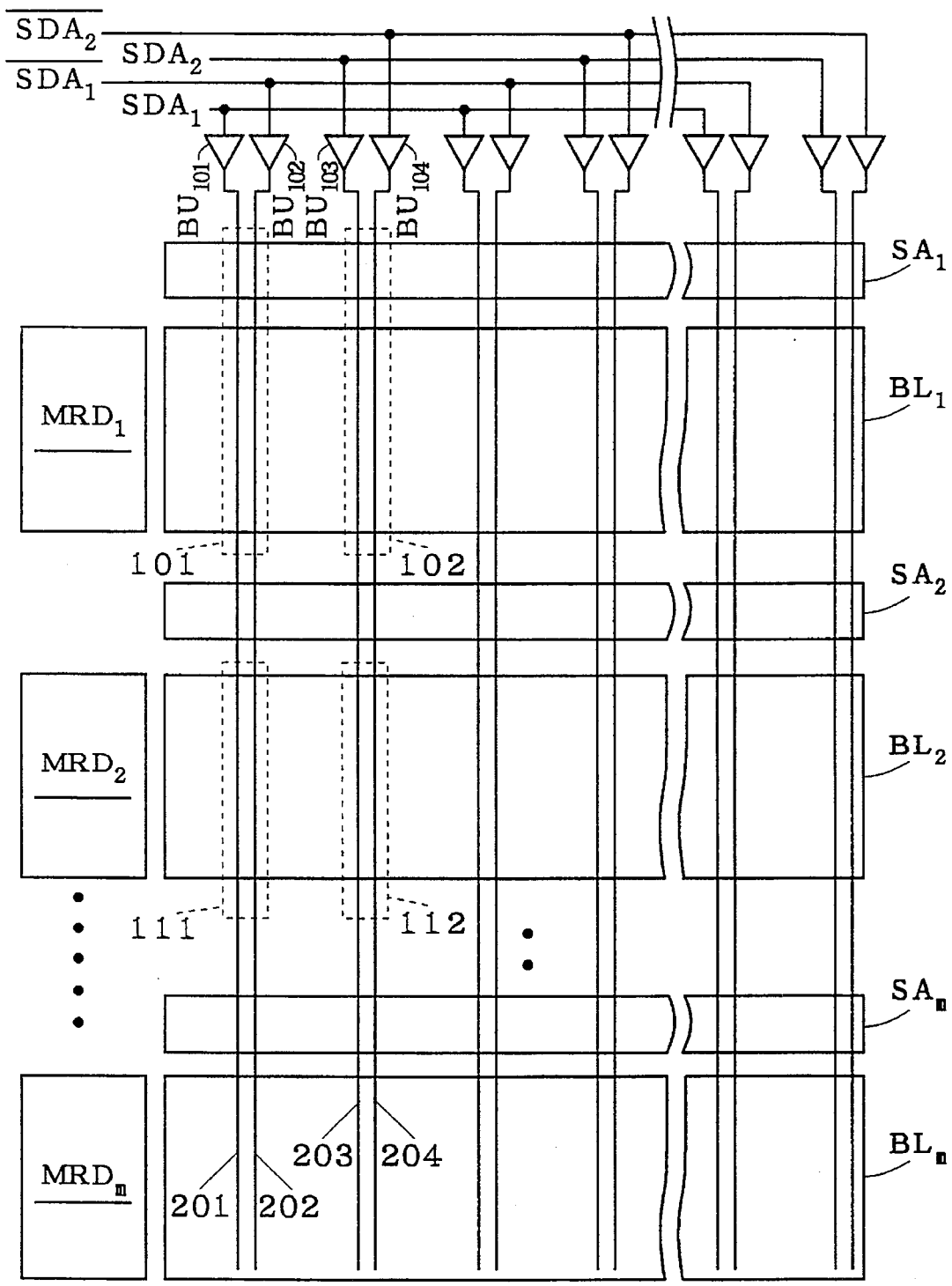
FIG. 16 is a block diagram showing a possible configuration when the split decoder system is applied to a conventional semiconductor memory device with a memory cell array split into a plurality of blocks.
Figure 17:
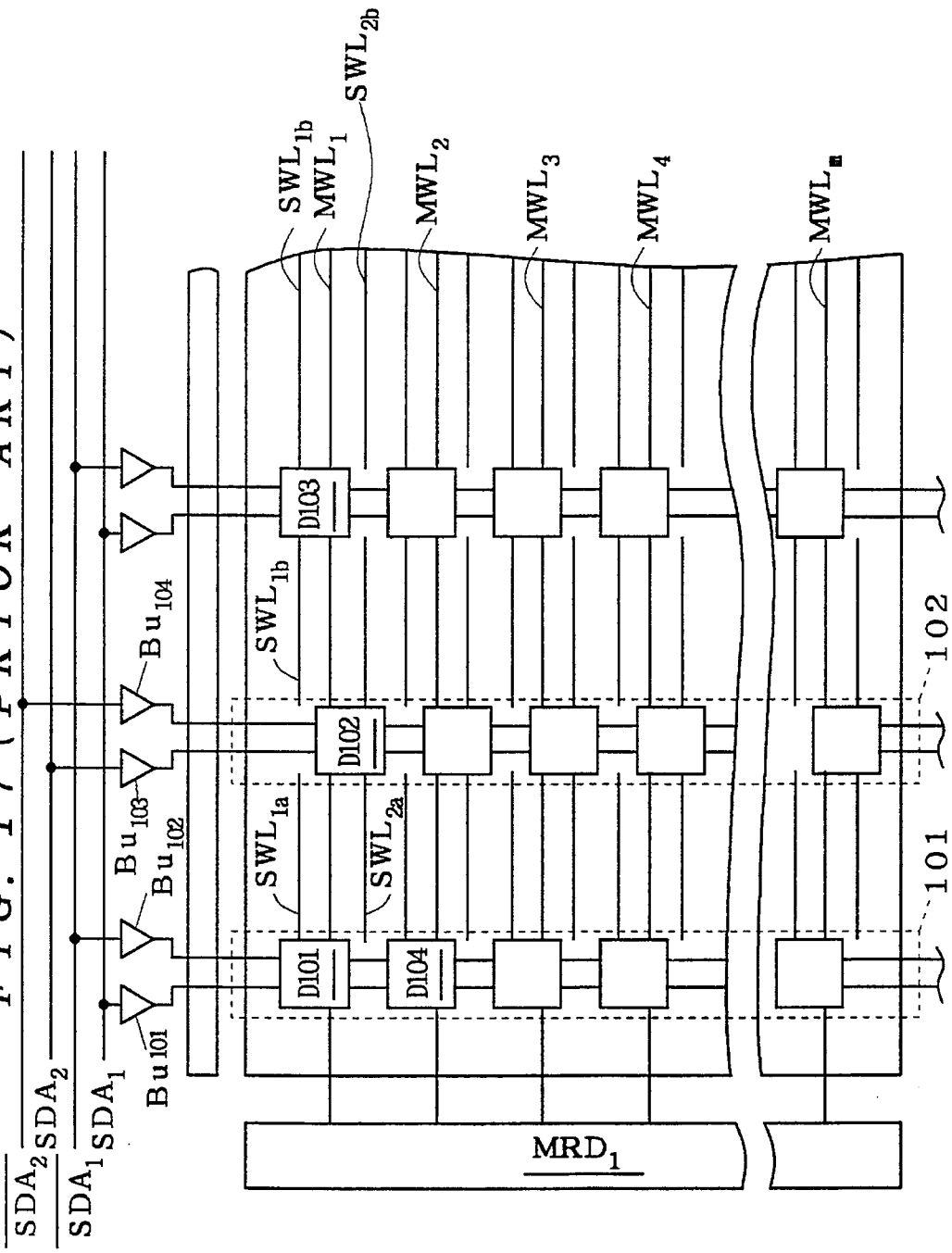
FIG. 17 is a block diagram showing arrangement of subdecode circuits in the memory cell array of the semiconductor memory device shown in FIG. 16.
Figure 18:
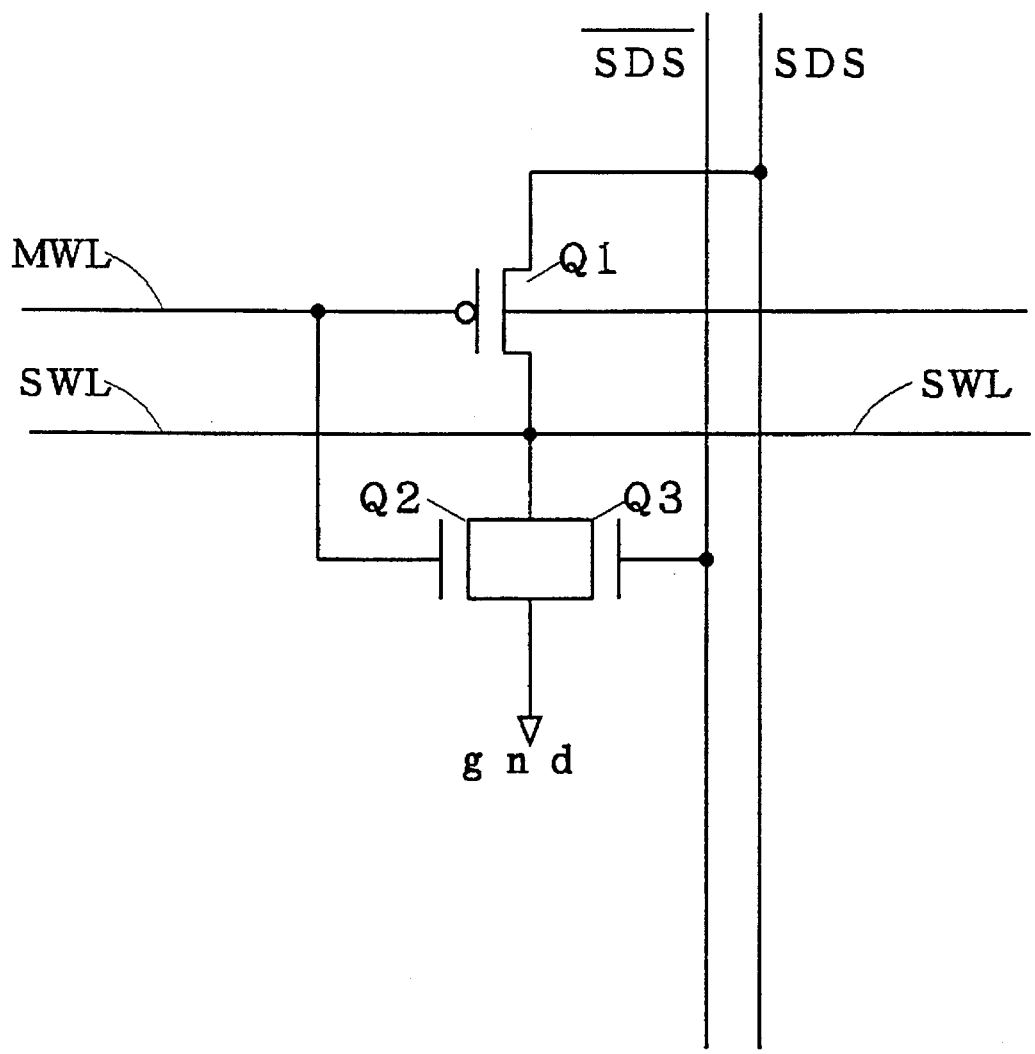
FIG. 18 is a circuit diagram showing structure of a conventional subdecode circuit.

As has been described above, the semiconductor memory device shown in FIG. 2 and FIG. 3 has the structure having main and sub word lines by the 2-way alternate arrangement type subdecode system similarly to the semiconductor memory device shown in FIG. 16 to simplify the description, but the same effects are produced if it is of the 4 or higher-ways.

Second Preferred Embodiment

Figure 4:
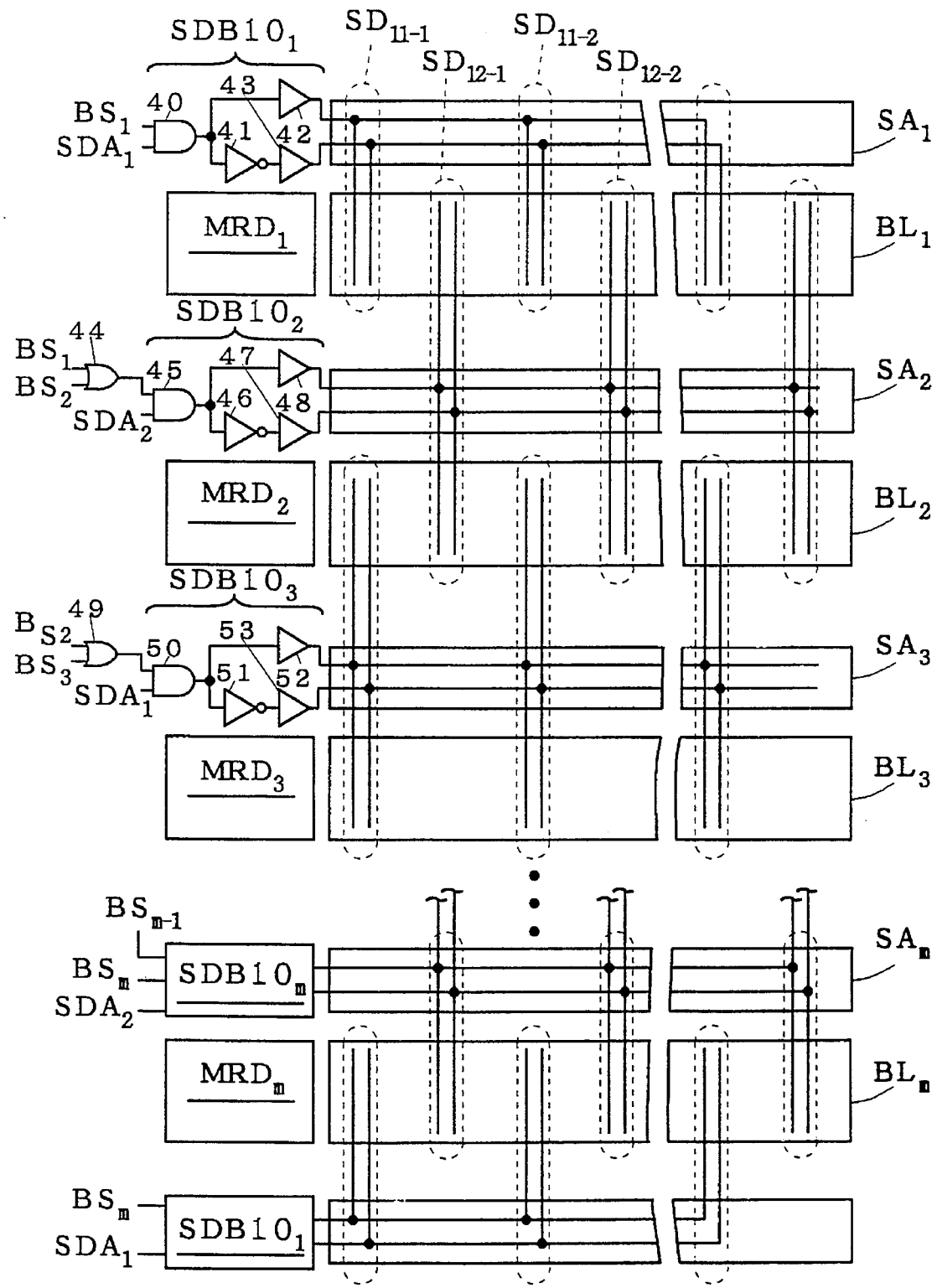
FIG. 4 is a block diagram showing arrangement of circuits around the memory cell array of the semiconductor memory device according to a second preferred embodiment of the present invention.

Next, a semiconductor memory device according to a second preferred embodiment of the present invention will be described referring to FIG. 4 and FIG. 5. FIG. 4 is a block diagram for illustrating the relation between respective blocks in a memory cell array and subdecode signals of the semiconductor memory device of the second preferred embodiment of the present invention. FIG. 5 is a block diagram illustrating arrangement of subdecode circuits in the block $BL_1$ shown in FIG. 4. The difference between the semiconductor memory device of the second preferred embodiment and that of the first preferred embodiment resides in the way of providing the subdecode signals to each of the blocks $BL_1$–$BL_m$ in the second preferred embodiment and the way of providing the subdecode signals in the first preferred embodiment.

In FIG. 4, $SDB10_1$–$SDB10_m$ are subdecode signal generation circuits. For example, the subdecode signal generation circuit $SDB10_1$ is disposed on the side of the upper side of the main row decoder $MRD_1$ and includes an AND gate 40 for ANDing the address $BS_1$ for block selection and the address $SDA_1$ for subdecode signal, a buffer 42 for transmitting the output of the AND gate 40 to the block $BL_1$ as a subdecode signal, a NOT gate 41 for outputting a logical value opposite to the output of the AND gate 40 and a buffer 43 for transmitting the output of the NOT gate 41 to the block $BL_1$ as a subdecode signal.

The subdecode signal generation circuit $SDB10_2$ includes an OR gate 44 for ORing the addresses $BS_1$ and $BS_2$ for block selection, an AND gate 45 for ANDing the output of the OR gate 44 and the address $SDA_2$ for subdecode signal, a buffer 48 for transmitting the output of the AND gate 45 to the blocks $BL_1$ and $BL_2$ as a subdecode signal, a NOT gate 46 for outputting a logic value opposite to the output of the AND gate 45, and a buffer 47, for transmitting the output of the NOT gate 46 to the blocks $BL_1$ and $BL_2$ as a subdecode signal.

The subdecode signal generation circuit $SDB10_3$ includes an OR gate 49 for ORing the addresses $BS_2$ and $BS_3$ for block selection, an AND gate 50 for ANDing the output of the OR gate 49 and the address $SDA_1$ for subdecode signal, a buffer 52 for transmitting the output of the AND gate 50 to the blocks $BL_2$ and $BL_3$ as a subdecode signal, a NOT gate 51 for outputting a logical value opposite to the output of the AND gate 50, and a buffer 53 for transmitting the output of the NOT gate 51 to the blocks $BL_2$ and $BL_3$ as a subdecode signal.

In FIG. 5, the $SDS_1$, $\overline{SDS_1}$ are subdecode signals outputted by the subdecode signal generation circuit $SDB10_1$, the $SDS_2$, $\overline{SDS_2}$ are subdecode signals outputted by the subdecode signal generation circuit $SDB10_2$, and the same reference characters as those in FIG. 3 denote corresponding parts shown in FIG. 3.

For example, the subdecode signals $SDS_1$ and $\overline{SDS_1}$ are supplied from signal lines provided on the sense amplifier column $SA_1$ on the side of the upper side of the block $BL_1$ and the subdecode signals $SDS_2$, $\overline{SDA_2}$ are supplied from signal lines provided on the sense amplifier column $SA_2$ on the side of the lower side of the block $BL_1$. This way of supplying subdecode signals allows supply of the subdecode signals $SDS_2$, $\overline{SDS_2}$ also to the block $BS_2$, thus allowing adjacent blocks $BL_1$ and $BL_2$ to share the subdecode signals running in the bit line direction.

Accordingly, the subdecode bands $SD_{12-1}$, $SD_{12-2}$ etc. supplied with the same subdecode signals $SDS_2$, $\overline{SDS_2}$ lie over the block $BL_1$ and the block $BL_2$.

For example, when selecting a memory cell in the block $BL_2$, the address $BS_2$ for block selection enables the subdecode signal generation circuits $SDB10_2$, $10_3$ to output the subdecode signals $SDS_2$, $\overline{SDS_2}$, $SDS_3$, $\overline{SDS_3}$.

This can reduce the number of signal lines for transmitting the subdecode signals running on the sense amplifier column to half. Other effects are the same as those in the semiconductor memory device shown in the first preferred embodiment. Although the description has been made on the 2-way structure in the second preferred embodiment, sharing between adjacent blocks is possible with 4 or more ways.

Third Preferred Embodiment

Figure 6:
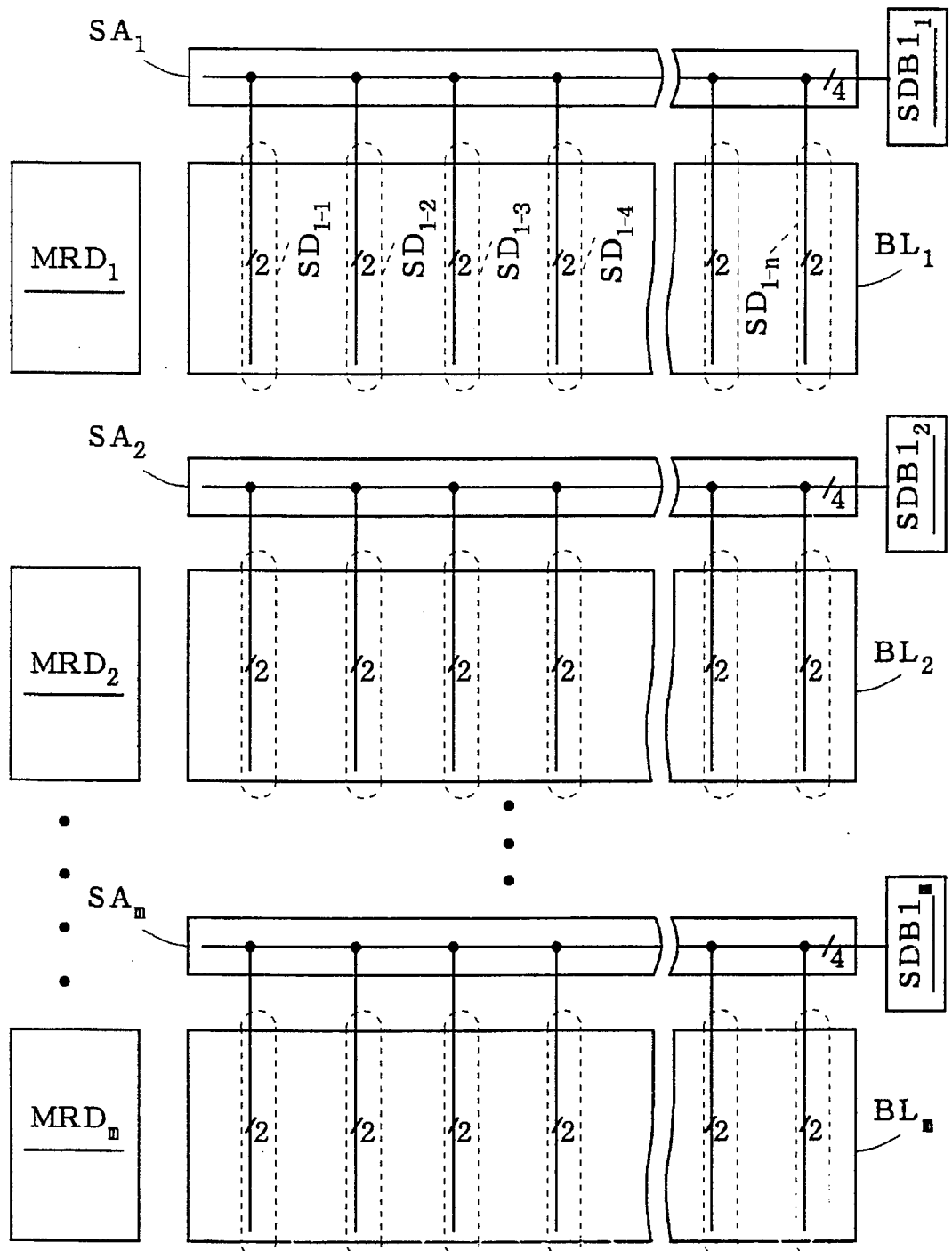
FIG. 6 is a block diagram showing arrangement of circuits around a memory cell array of a semiconductor memory device according to a third preferred embodiment of the present invention.

Next, a semiconductor memory device according to a third preferred embodiment of the present invention will be described referring to FIG. 6. FIG. 6 is a block diagram illustrating positional relation between a memory cell array and peripheral circuits thereof of a semiconductor memory device according to the third preferred embodiment of the present invention. In FIG. 6, the same reference characters as those in FIG. 2 denote parts corresponding to those with the same reference characters in FIG. 2. As shown in FIG. 2, in the semiconductor memory device of the first preferred embodiment, the subdecode signal generation circuits $SDB1_1$–$SDB1_m$ are disposed between the areas in which the main row decoders $MRD_1$–$MRD_m$ are disposed, or in the area adjacent to the main row decoders and the sense amplifier columns, i.e., on the left side of the blocks $BL_1$–$BL_m$.

In the semiconductor memory device of the third preferred embodiment, they are provided on the side of the peripheral circuit band in which the peripheral circuits are formed on the side opposite to the areas in which the main row decoders $MRD_1$–$MRD_m$ are formed with the memory cell array interposed therebetween, i.e., on the side of the right sides of the blocks $BL_1$–$BL_m$ of the memory cell array. Originally, control circuits of SA etc. are provided on the side of the left side of the memory cell array in which the main row decoders are provided, it may therefore be difficult to ensure a place to dispose the subdecode signal generation circuits $SDB1_1$–$SDB1_m$. The effects of using the semiconductor memory device of the third preferred embodiment are the same as those of the first preferred embodiment, for they differ only in arrangement of the subdecode signal generation circuits $SDB1_1$–$SDB1_m$.

Fourth Preferred Embodiment

Figure 7:
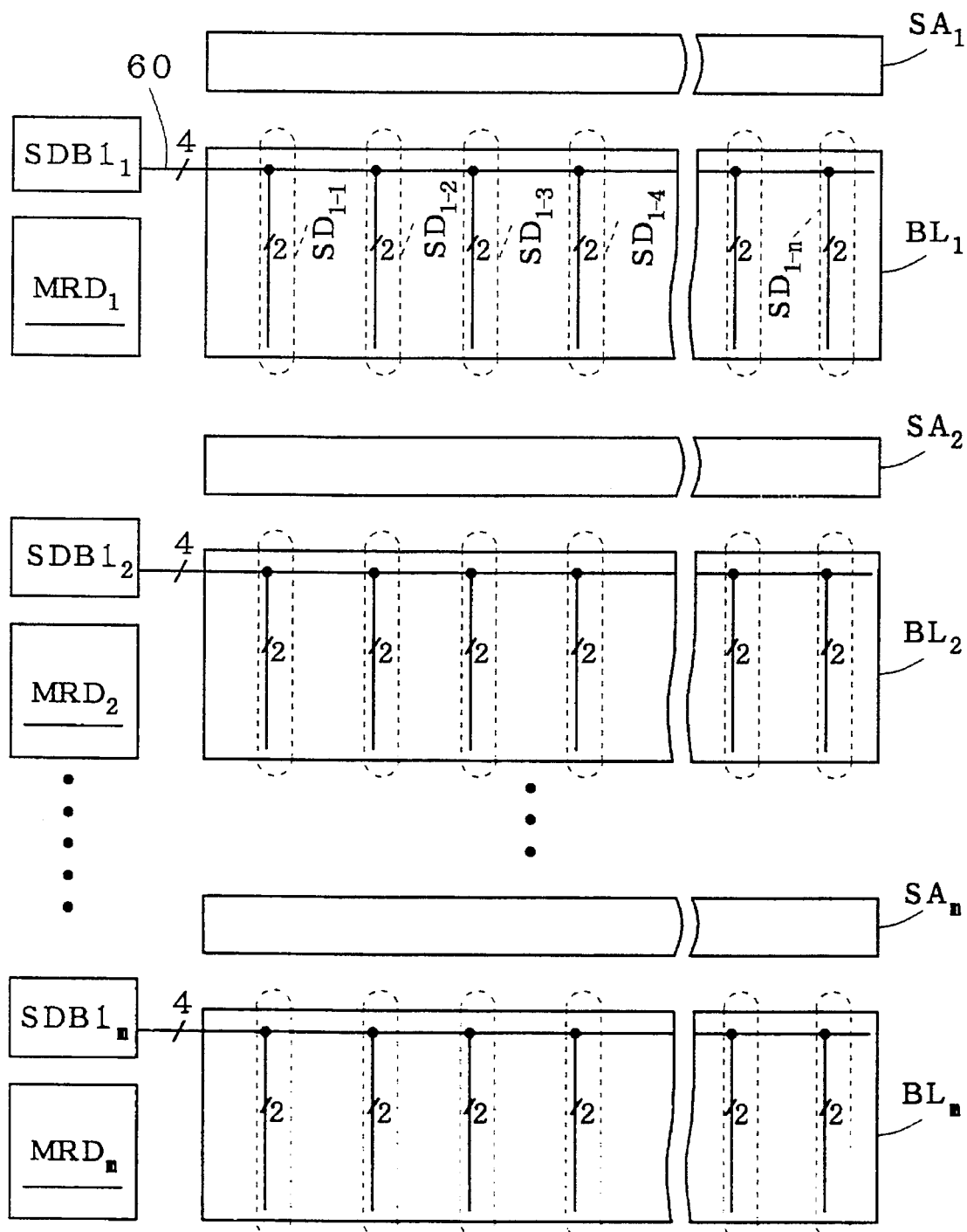
FIG. 7 is a block diagram showing an example of arrangement of circuits around a memory cell array of a semiconductor memory device according to a fourth preferred embodiment of the present invention.

Next, a semiconductor memory device according to a fourth preferred embodiment will be described referring to FIG. 7. FIG. 7 is a block diagram illustrating the positional relation between a memory cell array and peripheral circuits thereof of the semiconductor memory device of the fourth preferred embodiment of the present invention. In FIG. 7, 60 denotes a bus for transmitting subdecode signals, and the same reference characters as those in FIG. 2 denote parts corresponding to those with the same reference characters in FIG. 2. The bus 60 is formed of a plurality of signal lines.

In the semiconductor memory device of the first preferred embodiment, the signal lines for transmitting the subdecode signals are provided on the sense amplifier columns $SA_1$–$SA_m$. The use of main and sub word lines according to the split decoder system moderates pitches of the first metal interconnections used as interconnections of main word lines, which allows arrangement of the signal lines forming the bus 60 transmitting the subdecode signals on the respective blocks $BL_1$–$BL_m$ of the memory cell array, i.e., in the main word line spaces. For example, a single signal line is provided in a single main word line space. The position of signal line in the main word line space does not necessarily have to be in the end of the block, but it may be provided in the middle. This removes the necessity of providing extra signal lines on the sense amplifier columns $SA_1$–$SA_m$, which controls an increase in width of the sense amplifier columns $SA_1$–$SA_m$. Arrangement of signal lines for transmitting the subdecode signals is the only change, and other effects of the use of the semiconductor memory device of the fourth preferred embodiment are therefore the same as those in the first preferred embodiment.

Figure 8:
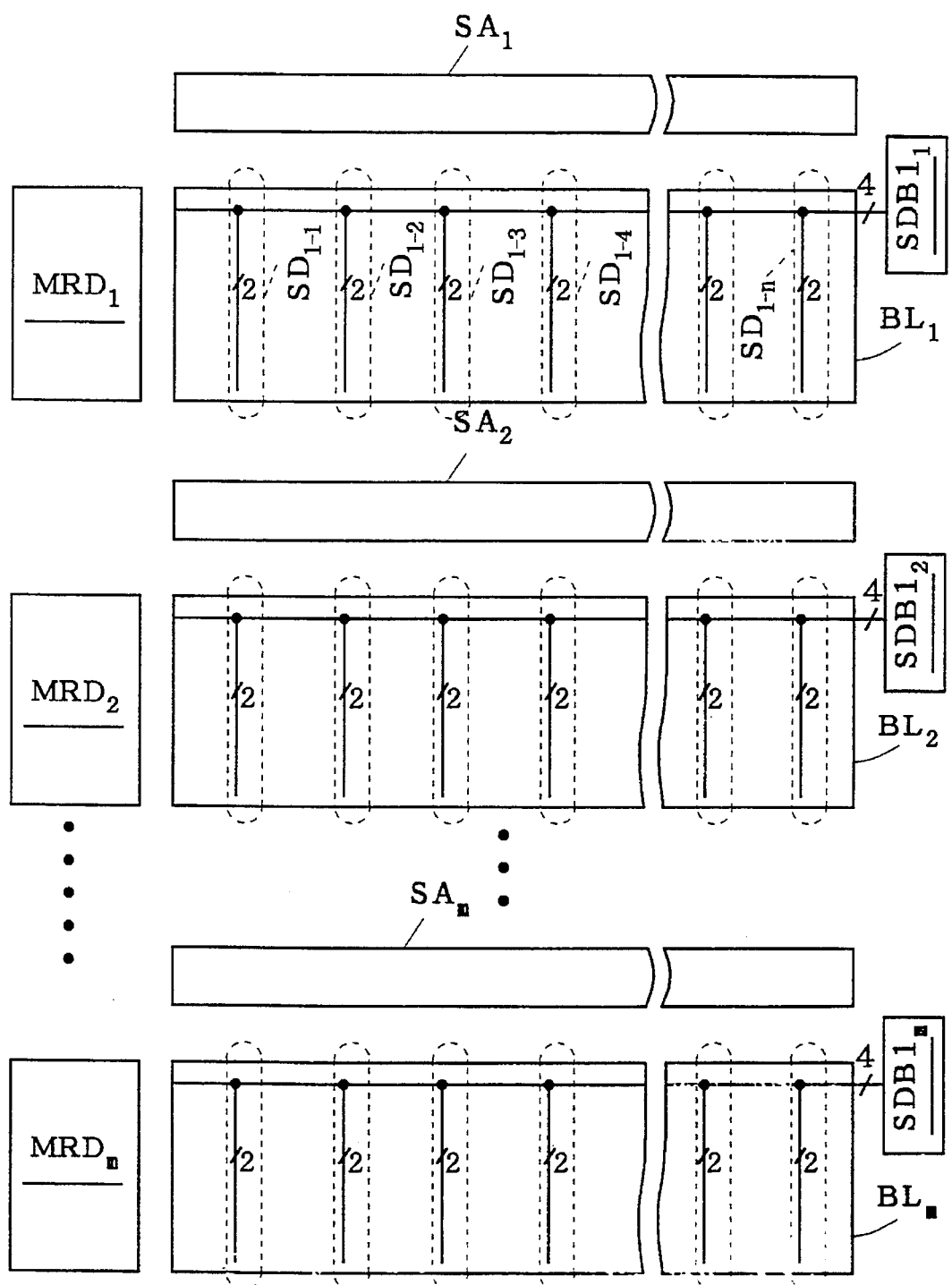
FIG. 8 is a block diagram showing another example of arrangement of circuits around the memory cell array of the semiconductor memory device according to the fourth preferred embodiment of the present invention.

As shown in FIG. 8, similarly to the relation between the semiconductor memory device of the first preferred embodiment and that of the third preferred embodiment, the subdecode signal generation circuits $SDB1_1$–$SDB1_m$ may be provided on the side of the peripheral circuit band, that is to say, on the side of the right sides of the blocks $BL_1$–$BL_m$. This removes the restriction in arrangement of the signal lines for transmitting subdecode signals and subdecode signal generation circuits, increasing the degree of freedom in layout, so that arrangement of other control circuits, such as sense amplifier control circuits etc. can be optimized, similarly to the third preferred embodiment.

Fifth Preferred Embodiment

Figure 9:
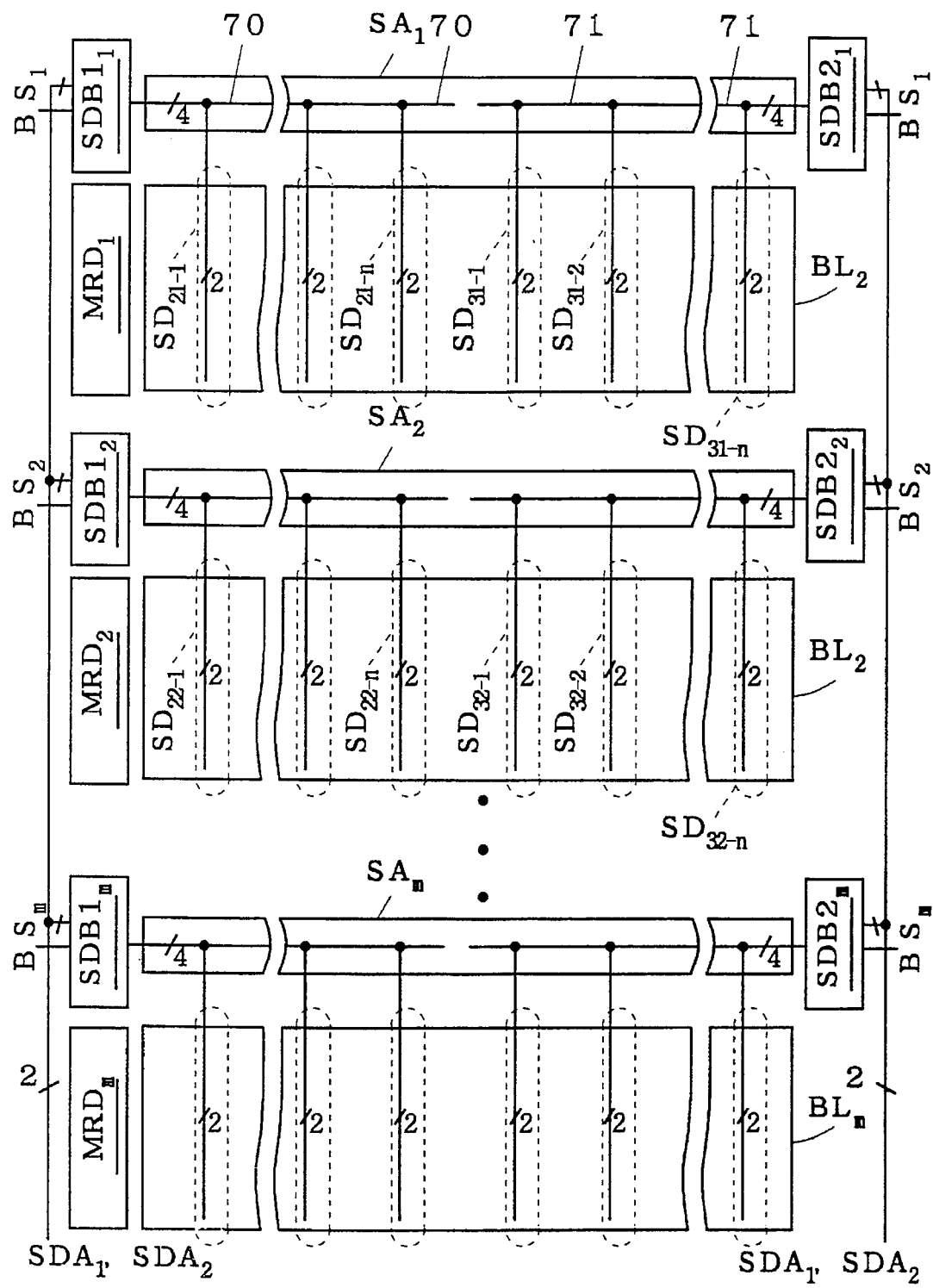
FIG. 9 is a block diagram showing an example of arrangement of circuits around a memory cell array of a semiconductor memory device according to a fifth preferred embodiment of the present invention.

Next, a semiconductor memory device according to a fifth preferred embodiment of the present invention will be described referring to FIG. 9. FIG. 9 is a block diagram illustrating the relation between a memory cell array and circuits around it of the semiconductor memory device of the present invention. In FIG. 9, $SDB2_1$–$SDB2_m$ denote subdecode signal generation circuits provided corresponding to the blocks $BL_1$–$BL_m$ and having the same structure as the subdecode signal generation circuits $SDB1_1$–$SDB1_m$, 70, 71 denote buses for transmitting subdecode signals outputted by the subdecode signal generation circuits $SDB1_1$, $SDB2_1$, and the same reference characters as those in FIG. 2 denote parts corresponding to those with the same characters in FIG. 2.

If the number of memory cells per row of a memory cell array increases and the main word lines are lengthened, load of a subdecode signal line for transmitting subdecode signals, which has almost the same length as the main word line, becomes too large, and then rise and fall of the subdecode signal may be slowed In such a case, the buses 70, 71 transmitting the subdecode signals are split at the middle with the main word line having the same length as the block $BL_1$–$BL_m$, width, and the subdecode signal generation circuits $SDB1_1$–$SDB1_m$ and $SDB2_1$–$SDB2_m$ having the same structure are provided on both sides of the blocks $BL_1$–$BL_m$ to drive the buses 70, 71.

This can reduce the interconnection and gate load driven by a single subdecode signal generation circuit to half, thereby speeding up rise and fall of the subdecode signals. This can be applied to the case of sharing a subdecode signal generation circuit between adjacent blocks like the semiconductor memory device of the second preferred embodiment, which produces the same effects as those of the preferred embodiments discussed above.

Figure 10:
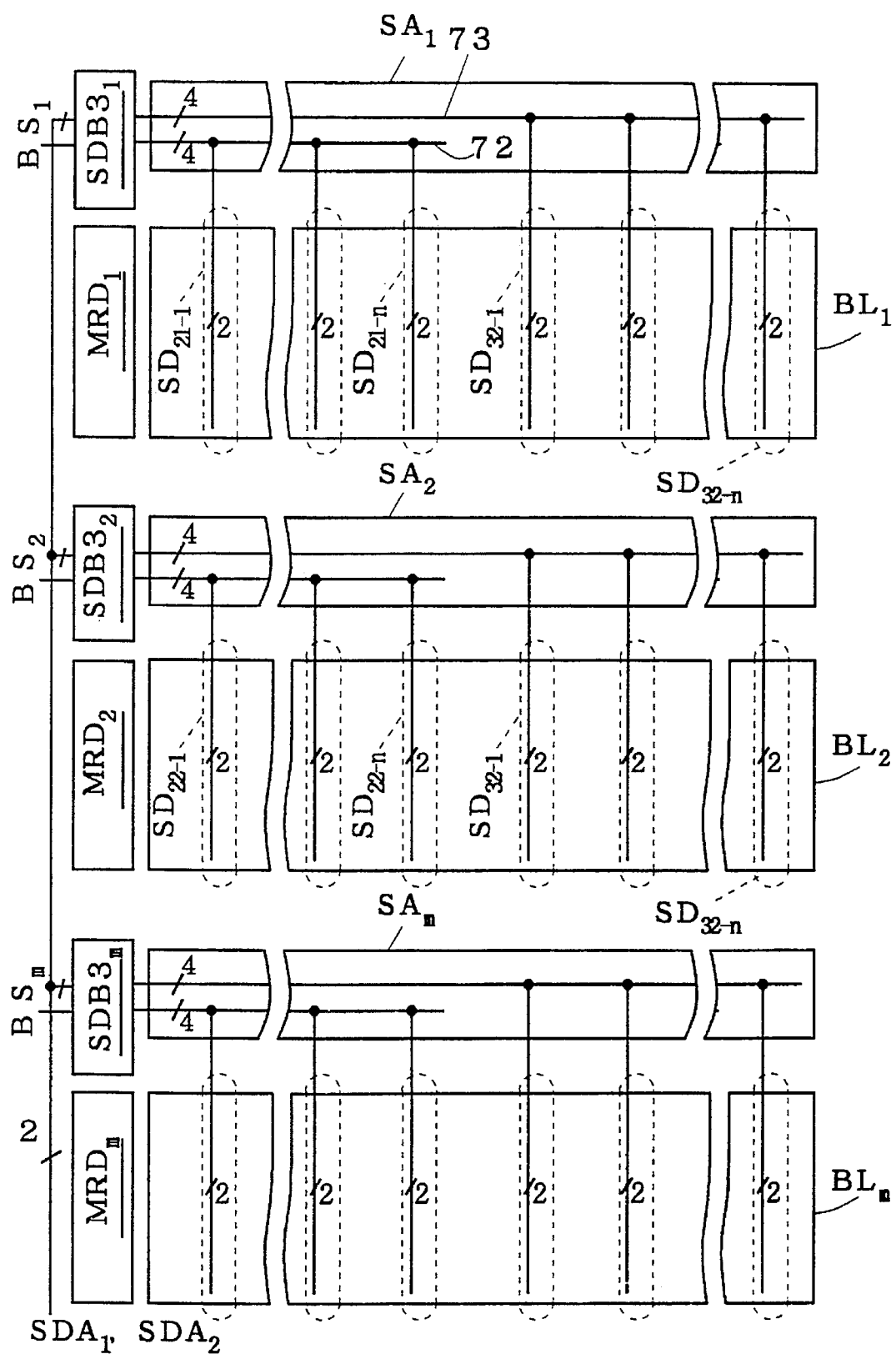
FIG. 10 is a block diagram showing another example of arrangement of circuits around the memory cell array of the semiconductor memory device according to the fifth preferred embodiment of the present invention.

As shown in FIG. 10, although the signal line transmitting subdecode signals is divided in the fifth preferred embodiment, the subdecode signals may be supplied from one side and gate load only may be distributed. In FIG. 10, $SDB3_1$–$SDB3_m$ denote subdecode signal generation circuits which are combination of the subdecode signal generation circuits $SDB1_1$–$SDB1_m$ and the subdecode signal generation circuits $SDB2_1$–$SDB2_m$ shown in FIG. 9 which correspond to the respective blocks $BL_1$–$BL_m$ and 72, 73 denote buses for transmitting subdecode signals, which correspond to the buses 70, 71 shown in FIG. 9, respectively. In this case, the number of signal lines for subdecode signals provided in the respective sense amplifier columns $SA_1$–$SA_m$ increases, but the number of subdecode circuits is reduced and load of buffers for transmitting the subdecode signals is distributed, and the speed can be increased. Although the subdecode signal generation circuits are provided in the area on the side of the left sides of the blocks $BL_1$–$BL_m$ in which the main row decoders are provided, they may be provided on the side of the right sides of the blocks $BL_1$–$BL_m$.

Sixth Preferred Embodiment

Figure 11:
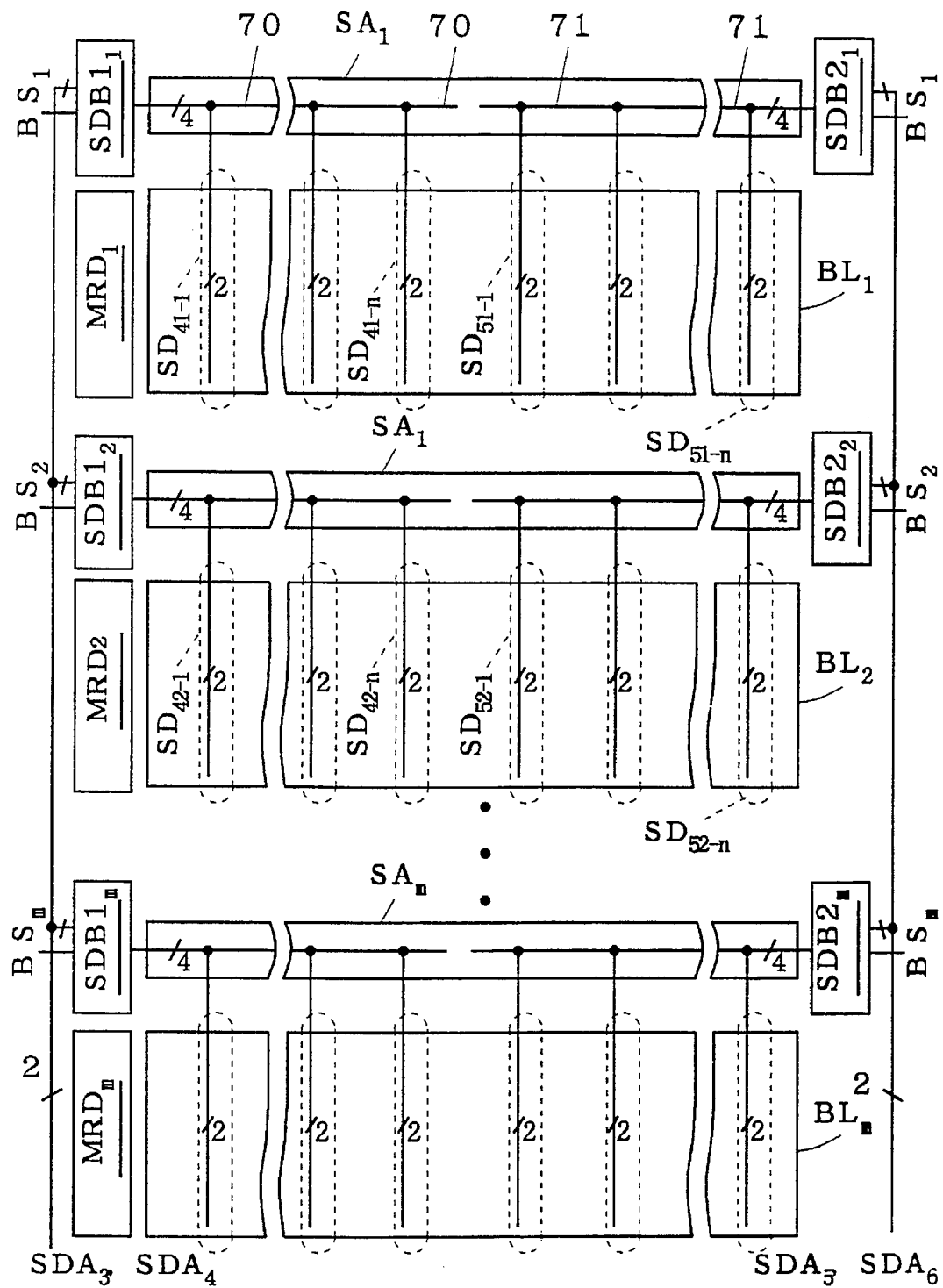
FIG. 11 is a block diagram showing arrangement of circuits around a memory cell array of a semiconductor memory device according to a sixth preferred embodiment of the present invention.

Next, a semiconductor memory device according to a sixth preferred embodiment of the present invention will be described referring to FIG. 11. FIG. 11 is a block diagram showing the relation between a memory cell array and circuits around it of a semiconductor memory device according to the sixth preferred embodiment of the present invention. In FIG. 11, $SDA_3$–$SDA_6$ denote addresses for subdecode signal and the same reference characters as those in FIG. 9 denote parts corresponding to those with the same reference characters in FIG. 9.

For example, the addresses $SDA_3$, $SDA_4$ for subdecode and the address $BS_1$ for block selection are provided to the subdecode signal generation circuit $SDB1_1$, and the addresses $SDA_5$, $SDA_6$ for subdecode and the address $BS_1$ for block selection are provided to the subdecode signal generation circuit $SDB2_1$.

Entering different signals into the subdecode signal generation circuits $SDB1_1$ and $SDB2_1$ having the same structure allows only a required subdecode signal generation circuit to operate. The same is true for other subdecode signal generation circuits $SDB1_2$–$SDB1_m$, $SDB2_2$–$SDB2_m$. Such structure enables complementary control of active and inactive of subdecode circuits belonging to the same row according as on which side of the block they exist. Hence, by selectively using the subdecode signal generation circuits $SDB1_1$, $SDB2_1$ provided on both sides, charge/discharge loads of the subdecode signal can be distributed, and the consumption power can be reduced and the speed can be increased. As shown in FIG. 10, the subdecode signal generation circuits may be provided on one side. It can be applied to the case of sharing subdecode signal generation circuits between adjacent blocks such as the semiconductor memory device of the second preferred embodiment, which produces the same effects.

Next, the addresses $SDA_3$–$SDA_6$ for subdecode will be described. For example, it is assumed that a high order bit of a row address is a bit for selecting a memory cell on either side from the center of the blocks $BL_1$–$BL_m$, i.e., a memory cell in an area allotted to the signal lines 72, 73, respectively. By ANDing the high order bit of the row address and the addresses $SDA_1$, $SDA_2$ for subdecode used in the fifth preferred embodiment, for example, the addresses $SDA_3$, SDA$_4$ for subdecode can be produced. Similarly, by ANDing a logic value opposite to the high order bit of the row address and the addresses SDA$_1$, SDA$_2$ used in the fifth preferred embodiment, for example, the addresses SDA$_5$, SDA$_6$ for subdecode can be produced.

Seventh Preferred Embodiment

Figure 12:
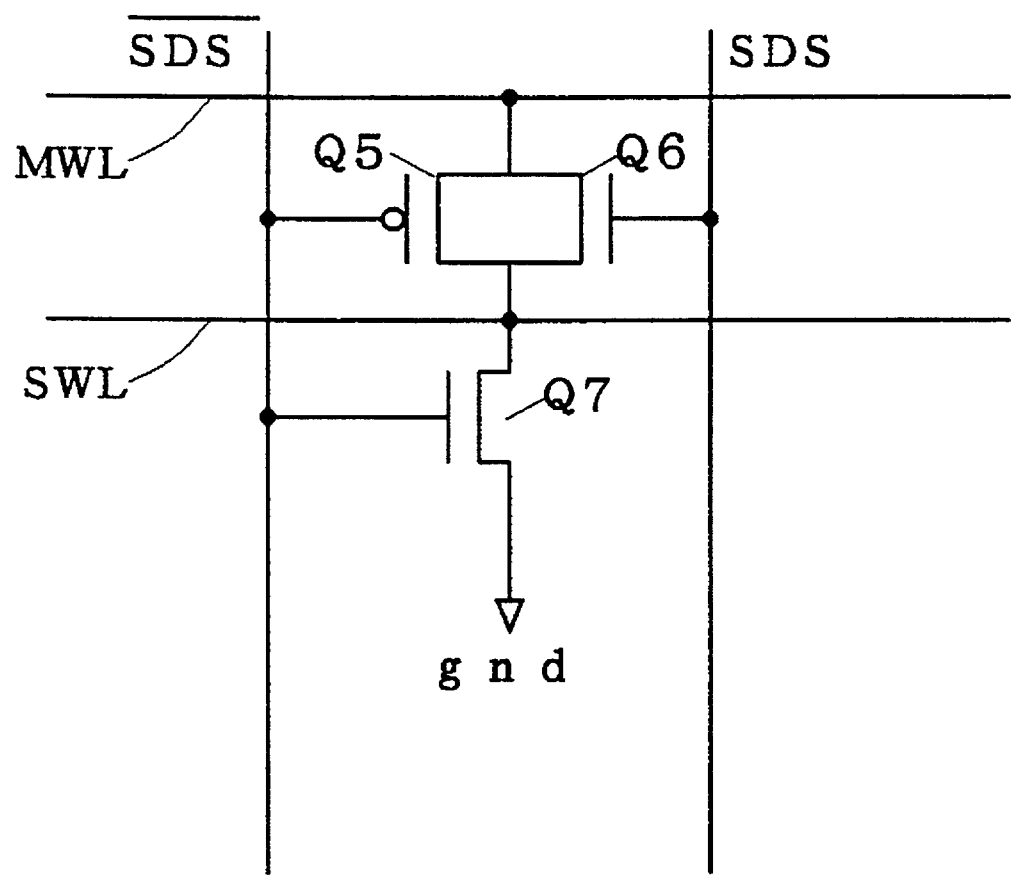
FIG. 12 is a circuit diagram showing configuration of a subdecode circuit of the semiconductor memory device according to a seventh preferred embodiment of the present invention.
Figure 13:
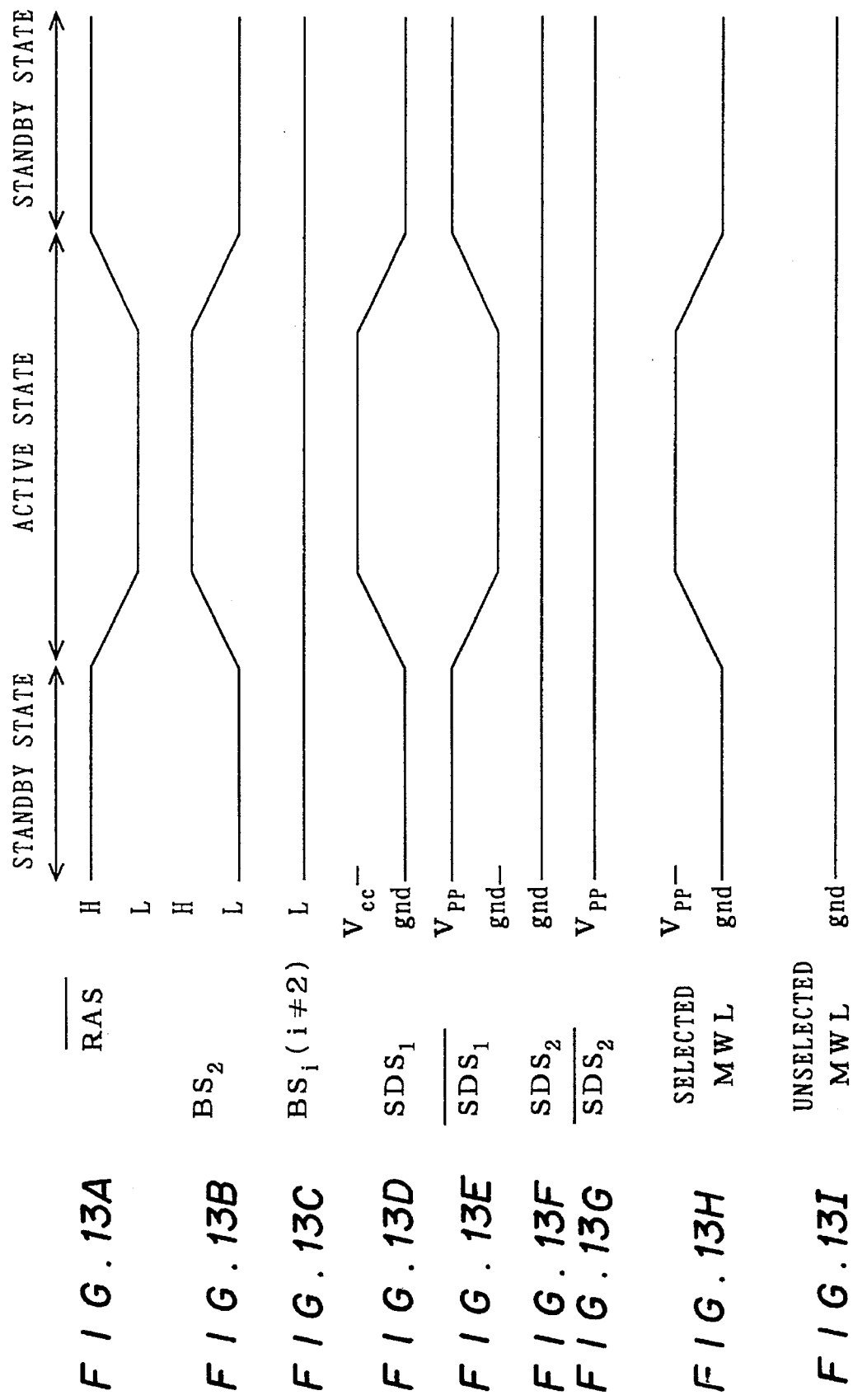
FIG. 13 is a timing chart showing operation of the semiconductor memory device according to the seventh preferred embodiment of the present invention.

Next, a semiconductor memory device according to a seventh preferred embodiment of the present invention will be described referring to FIG. 12 and FIG. 13. FIG. 12 is a block diagram showing the structure of a subdecode circuit of a semiconductor memory device of the seventh preferred embodiment of the present invention. In FIG. 12, Q5 denotes a PMOS transistor having its control electrode provided with a subdecode signal $\overline{SDS}$, one of its current electrodes connected to the main word line MWL and its other current electrode connected to the sub word line SWL, Q6 denotes an NMOS transistor having its control electrode provided with the subdecode signal SDS, one of its current electrodes connected to the main word line MWL and its other current electrode connected to the sub word line SWL, and Q7 denotes an NMOS transistor having one of its current electrodes connected to the sub word line SWL, its control electrode provided with the subdecode signal $\overline{SDS}$ and its other current electrode connected to a power supply providing the ground potential gnd.

The table 2 shows states of the main word line and the subdecode signals SDS, $\overline{SDS}$ in standby (when the row address strobe signal $\overline{RAS}$ is at a high level), when the subdecode circuit belongs to a block selected in operation and when the subdecode circuit belongs to a block unselected in operation.

TABLE 2

|  | Stand-by | Selected Block | | | | Un-Select Block |
|---|---|---|---|---|---|---|
|  |  | MWL Active Portion | | MWL Inactive Portion | | MWL Inactive |
|  |  | Sub-decode Circuit Active | Sub-decode Circuit Inactive | Sub-decode Circuit Active | Sub-decode Circuit Inactive | Sub-decode Circuit Inactive |
| MWL | gnd | V$_{PP}$ | V$_{PP}$ | gnd | gnd | gnd |
| SDS | gnd | V$_{CC}$ | gnd | V$_{CC}$ | gnd | gnd |
| $\overline{SDS}$ | V$_{PP}$ | gnd | V$_{PP}$ | gnd | V$_{PP}$ | V$_{PP}$ |

Next, operation of this circuit will be described referring to FIG. 13. For example, it is assumed that the block BL2 shown in FIG. 16 is selected. The address BS$_2$ for block selection corresponding to the block BL$_2$ changes from a low level to a high level in the operation state. At this time, the level of the voltage on the selected main word line MWL changes from gnd to V$_{PP}$. The level of voltage of other main word lines MWL remains gnd. It is also assumed that there are SDS$_1$, $\overline{SDS_1}$ SDS$_2$, $\overline{SDS_2}$ as subdecode signals supplied to the block BL$_2$. Then, in the operation state, the voltage V$_{CC}$ is applied as the subdecode signal SDS$_1$ to activate certain subdecode circuits, the voltage gnd is applied as the subdecode signal $\overline{SDS_1}$, and the voltage gnd as the subdecode signal SDS$_2$ is applied to deactivate other subdecode circuits, and the voltage V$_{PP}$ is applied as the subdecode signal $\overline{SDS_2}$.

The same signals are provided to subdecode circuits in the case of the standby and in the case where the subdecode circuits belong to unselected blocks and subdecode circuits deactivated by the subdecode signals irrespectively in the case where main word lines are active in a selected block, that is, the voltage gnd is applied to the main word line MWL of that subdecode circuit, the voltage gnd is applied as the subdecode signal SDS, and the voltage V$_{PP}$ is applied as the subdecode signal $\overline{SDS}$. At this time, in the subdecode circuit shown in FIG. 12, the transistors Q5, Q6 enter a non-conducting state and the transistor Q7 enters a conducting state. At this time, the voltage gnd is provided to the sub word line SWL through the transistor Q7.

Next, operation when the main word line MWL connected to the subdecode circuit is activated and the voltage V$_{PP}$ is provided will be described. The voltage V$_{CC}$ is applied as the subdecode signal SDS to the subdecode circuit with its connected sub word line activated, and the voltage gnd is provided as the subdecode signal $\overline{SDS}$. At this time, the transistors Q5, Q6 enter a conducting state and the transistor Q7 enters a non-conducting state. Accordingly, the voltage V$_{PP}$ is supplied from the main word line MWL to the sub word line SWL through the transistors Q5, Q6. On the other hand, to a subdecode circuit with its connected sub word line not activated, the voltage gnd is applied as the subdecode signal SDS and the voltage V$_{PP}$ is applied as a subdecode signal. At this time, the transistors Q5, Q6 enter a non-conducting state and the transistor Q7 enters a conducting state, and then the voltage gnd is supplied to the sub word line SWL through the transistor Q7.

If the subdecode signal is a signal which will activate the sub word line regardless of the main word line MWL to which the subdecode circuit is connected being inactive, i.e., when the voltage gnd is provided to the main word line MWL, the voltage V$_{CC}$ as the subdecode signal SDS, and the voltage grid as the subdecode signal $\overline{SDS}$ are applied, the transistor Q6 enters a conducting state and the transistor Q7 enters a non-conducting state, and then the voltage gnd is provided to the sub word line SWL from the main word line MWL through the transistor Q6.

By using a subdecode circuit having such configuration as shown in FIG. 12, the voltage gnd is provided as a voltage in standby to the main word lines MWL which outnumber the signal lines provided to transmit subdecode signals in the memory cell array, so that the power consumption by leakage current can be reduced in comparison with the conventional semiconductor memory device in which the voltage V$_{PP}$ is applied to the main word lines, and malfunctions caused by reduction of voltage level can be prevented.

Eighth Preferred Embodiment

Figure 14:
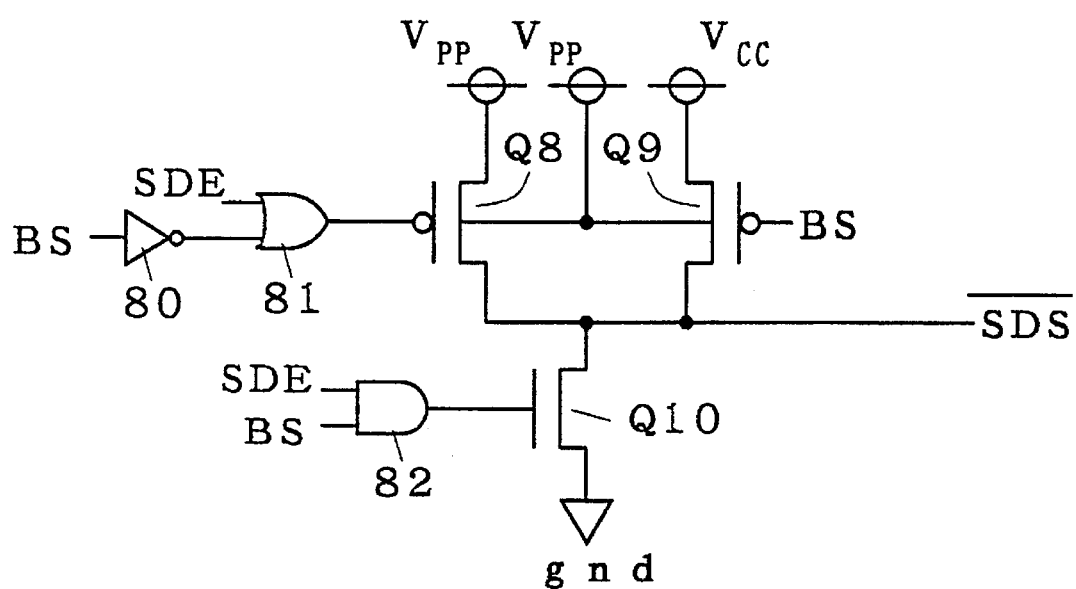
FIG. 14 is a circuit diagram showing configuration of a converting circuit of a subdecode signal of the semiconductor memory device according to an eighth preferred embodiment of the present invention.

Next, a semiconductor memory device according to an eighth preferred embodiment of the present invention will be described referring to FIG. 14 and FIG. 15. FIG. 14 is a circuit diagram showing the structure of a circuit for converting subdecode signals of a semiconductor memory device of the eighth preferred embodiment of this invention. In FIG. 14, 80 denotes a NOT gate for outputting a signal having a logical value opposite to that of the address BS for block selection, 81 denotes an OR gate for ORing the output of the NOT gate 80 and a subdecode signal SDE corresponding to the subdecode signal SDS shown in Table 2, Q8 denotes a PMOS transistor having its source supplied with the voltage V$_{PP}$, its gate receiving output of the OR gate 81 and its drain, 82 denotes an AND gate for ANDing the subdecode signal SDE and the address BS for block selection, Q9 denotes a PMOS transistor having its source supplied with the voltage V$_{CC}$, its gate provided with the address BS for block selection and its drain connected to the drain of the transistor Q8, and Q10 denotes an NMOS transistor having its drain connected to the drain of the transistor Q5, its gate connected to the output of the AND gate 82 and its source provided with the ground voltage gnd. The subdecode signal $\overline{SDS}$ is outputted from the drain of the transistor Q8. Now, the address BS for block selection and the subdecode circuit activating signal SDE attain a high level when selecting. All the logic gates shown in FIG. 14 are driven by the voltage $V_{PP}$.

Figure 15:
FIG. 15 is a timing chart showing operation of the semiconductor memory device according to the eighth preferred embodiment of the present invention.

FIG. 15 is a timing chart showing states of the subdecode signals. Table 3 shows states of the main word line and the subdecode signals SDS, $\overline{SDS}$ in standby (when a row address strobe signal $\overline{RAS}$ is at a high level), when a subdecode circuit belongs to the block selected in operation, and when the subdecode circuit belongs to a block unselected in operation.

TABLE 3

|  | Stand-by | Selected Block | | | | Un-Select Block |
|---|---|---|---|---|---|---|
|  |  | MWL Active Portion | | MWL Inactive Portion | | MWL Inactive |
|  |  | Sub-decode Circuit Active | Sub-decode Circuit Inactive | Sub-decode Circuit Active | Sub-decode Circuit Inactive | Sub-decode Circuit Inactive |
| MWL | gnd | $V_{PP}$ | $V_{PP}$ | gnd | gnd | gnd |
| SDS | gnd | $V_{CC}$ | gnd | $V_{CC}$ | gnd | gnd |
| $\overline{SDS}$ | $V_{CC}$ | gnd | $V_{PP}$ | gnd | $V_{PP}$ | $V_{CC}$ |

In FIG. 15, it is assumed that the subdecode signals $SDS_1$, $\overline{SDS_1}$ are signals to be provided to subdecode circuits belonging to a selected block and connected to a sub word line to be activated. In an operation state, the subdecode circuit activating signal SDE attains a high level and the address BS for block selection attains a high level, and only the transistor Q10 enters a conducting state in the subdecode signal converting circuit shown in FIG. 14, and then the voltage gnd is outputted as the subdecode signal $\overline{SDS_1}$.

The subdecode signals $SDS_2$, $\overline{SDS_2}$ are assumed to be signals provided to subdecode circuits which belong to the selected block but which are connected to sub word lines to be inactive. In an operation state, the subdecode circuit activating signal SDE is at a low level and the address BS for block selection goes a high level, and the transistor Q8 only enters a conducting state, and then the voltage $V_{PP}$ is outputted as the subdecode signal $\overline{SDS_2}$. At this time, if the voltage $V_{CC}$ is outputted as the subdecode signal $\overline{SDS_2}$, the transistor Q5 enters a conducting state, causing a malfunction.

The subdecode signals $SDS_3$, $\overline{SDS_3}$ are assumed to be signals to be provided to subdecode circuits belonging to an unselected block. They are the same as the signals provided to subdecode circuits in standby. In the operation state, the address BS for block selection goes a low level and only the transistor Q9 attains a conducting state, and then the voltage $V_{CC}$ is outputted as the subdecode signal $\overline{SDS}$.

By configuring as described above, since the voltage on a signal line in standby is maintained at the low voltage $V_{CC}$, reduction of level of the voltage $V_{PP}$ can be prevented in standby and the power consumption can be suppressed more effectively in the semiconductor memory device of the eighth preferred embodiment in comparison with the semiconductor memory device of the seventh preferred embodiment. Although the voltage $V_{CC}$ is provided as the subdecode signal $\overline{SDS}$ to blocks except a particular block to reduce the power consumption because the subdecode signals are converted in accordance with the address BS for block selection, it may be controlled using the row address strobe signal $\overline{RAS}$ which controls whether it is standby or not, though power consumption may somewhat increase.

While the invention has been described in detail, the foregoing description is an all aspects illustrative and not restrictive. It is understood that numerous other modifications and variations can be devised without departing from the scope of the invention.

I claim:

1. A semiconductor memory device, comprising:

a memory cell array divided into a plurality of blocks including at least first and second blocks, and having a plurality of memory elements arranged in a plurality of rows and a plurality of columns for dynamically storing information by storing charge and a plurality of main word lines and a plurality of sub word lines provided in each of said plurality of blocks and arranged parallel to said rows to select said memory elements, each of said plurality of blocks having first and second sides parallel to said rows and third and fourth sides parallel to said columns;

a plurality of sense amplifier columns each provided corresponding to each of said plurality of blocks and arranged facing said first side or said second side of corresponding said block;

a plurality of main row decode means provided corresponding to each of said plurality of blocks, arranged on the side of said third side of corresponding said block, for selectively activating said plurality of main word lines in said corresponding block;

a plurality of sub row decode means connected to said plurality of main word lines and said plurality of sub word lines and provided on said memory cell array;

a plurality of selection signal lines arranged parallel to said first or second sides and connected to said plurality of sub row decode means for transmitting selection signals for activating connected said sub row decode means; and a plurality of selection signal generating means connected to said plurality of selection signal lines for generating said selection signals;

said plurality of main word lines including at least a plurality of first main word lines provided in said first block and a plurality of second main word lines provided in said second block;

said plurality of sub word lines including at least a plurality of first sub word lines and a plurality of second sub word lines provided corresponding to said plurality of first main word lines, and a plurality of third sub word lines and a plurality of fourth sub word lines provided corresponding to said second main word lines;

said plurality of selection signal lines including at least a plurality of first selection signal lines and a plurality of second selection signal lines provided for said first block and a plurality of third selection signal lines and a plurality of fourth selection signal lines provided for said second block;

said plurality of sub row decode means including at least a plurality of first sub row decode means provided on said first block and connected to said plurality of first main word lines, said plurality of first sub word lines and said plurality of first selection signal lines, a plurality of second sub row decode means provided on said first block, and connected to said plurality of first main word lines, said plurality of second sub word lines and said plurality of second selection signal lines, a plurality of third sub row decode means provided on said second block and connected to said plurality of second main word lines, said plurality of third sub word lines and said plurality of third selection signal lines and a plurality of fourth sub row decode means provided on said second block and connected to said plurality of second main word lines, said plurality of fourth sub word lines and said plurality of fourth selection signal lines;

said plurality of selection signal generating means including at least first selection signal generating means provided corresponding to said first block, connected to said plurality of first selection signal lines, for generating and outputting a first selection signal, second selection signal generating means provided corresponding to said first block, connected to said plurality of second selection signal lines, for generating and outputting a second selection signal, third selection signal generating means provided corresponding to said second block, connected to said plurality of third selection signal lines, for generating and outputting a third selection signal, and fourth selection signal generating means provided corresponding to said second block, connected to said plurality of fourth selection signal lines, for generating and outputting a fourth selection signal;

wherein when any one of said plurality of first main word lines is activated, said first and second sub word lines are simultaneously placed into an activatable state by corresponding said first and second sub row decode means, and then it is selected by activation of said first or second selection signals in said first block which of said first and said second sub word line is to be activated; and wherein when any one of said plurality of second main word lines is activated, said third and fourth sub word lines are simultaneously placed into an activatable state by corresponding said third and fourth sub row decode means, and then it is selected by said third and fourth selection signals in said second block which of said third and fourth sub word lines is to be activated.

2. The semiconductor memory device according to claim 1, wherein said plurality of selection signal lines are provided on said plurality of sense amplifier columns.

3. The semiconductor memory device according to claim 1, wherein said plurality of selection signal generating means are provided on the side of said third sides of said plurality of blocks.

4. The semiconductor memory device according to claim 1, wherein said first and second blocks are provided adjacent to each other and share said second and third selection signal lines and said second and third selection signal generating means.

5. The semiconductor memory device according to claim 1, wherein said plurality of selection signal generating means are provided on the side of said fourth sides of said plurality of blocks.

6. The semiconductor memory device according to claim 1, wherein said plurality of selection signal lines are provided on said memory cell array.

7. The semiconductor memory device according to claim 1, wherein said selection signal generating means generates said selection signal from an address signal for selecting said memory element.

8. The semiconductor memory device according to claim 7, wherein said address signal includes a first address signal for block selection which specifies one block in said plurality of blocks and a second address signal for subdecode which specifies whether a memory cell column in that specified block is an even column or an odd column, and each of said plurality of selection signal generating means generates said selection signal from said first address signal and said second address signal.

9. The semiconductor memory device according to claim 8, wherein said first address signal and said second address signal have information content of 1 bit, respectively, and wherein each of said plurality of selection signal generating means comprises an AND gate for operating AND of said first address signal and said second address signal, and buffer means for buffering an output of said AND gate and transmitting it to said selection signal line.

10. The semiconductor memory device according to claim 1, wherein said plurality of sub word lines further include a plurality of fifth sub word lines and a plurality of sixth sub word lines provided corresponding to said plurality of first main word lines, and a plurality of seventh sub word lines and a plurality of eighth sub word lines provided corresponding to said second main word lines, said plurality of selection signal lines further include a plurality of fifth selection signal lines and a plurality of sixth selection signal lines provided for said first block and a plurality of seventh selection signal lines and a plurality of eighth selection signal lines provided for said second block, said plurality of sub row decode means further include a plurality of fifth sub row decode means provided on said first block and connected to said plurality of first main word lines, said plurality of fifth sub word lines and said plurality of fifth selection signal lines, a plurality of sixth sub row decode means provided on said first block, and connected to said plurality of first main word lines, said plurality of sixth sub word lines and said plurality of sixth selection signal lines, a plurality of seventh sub row decode means provided on said second block and connected to said plurality of second main word lines, said plurality of seventh sub word lines and said plurality of seventh selection signal lines and a plurality of eighth sub row decode means provided on said second block and connected to said plurality of second main word lines, said plurality of eighth sub word lines and said plurality of eighth selection signal lines, said plurality of selection signal generating means further include fifth selection signal generating means provided corresponding to said first block, connected to said plurality of fifth selection signal lines, for generating and outputting a fifth selection signal which is equivalent to said first selection signal, sixth selection signal generating means provided corresponding to said first block, connected to said plurality of sixth selection signal lines, for generating and outputting a sixth selection signal which is equivalent to said second selection signal, seventh selection signal generating means provided corresponding to said second block, connected to said plurality of seventh selection signal lines, for generating and outputting a seventh selection signal which is equivalent to said third selection signal, and eighth selection signal generating means provided corresponding to said second block, connected to said plurality of eighth selection signal lines, for generating and outputting an eighth selection signal which is equivalent to said fourth selection signal, wherein when any one of said plurality of first main word lines is activated, said first and second sub word lines and said fifth and sixth sub word lines are simultaneously placed into an activatable state by corresponding said first and second sub row decode means and said fifth and sixth sub row decode means, and then it is selected by said first and second selection signals and said fifth and sixth selection signals in said first block which set of said first and fifth sub word lines and said second and sixth sub word lines is to be activated, and when any one of said plurality of second main word lines is activated, said third and fourth sub word lines and said seventh and eighth sub word lines are simultaneously placed into an activatable state by corresponding said third and fourth sub row decode means and said seventh and eighth sub row decode means, and then it is selected by said third and fourth selection signals and said seventh and eighth selection signals in said second block which set of said third and seventh sub word lines and said fourth and eighth sub word lines is to be activated.

11. The semiconductor memory device according to claim 10, wherein said first through fourth selection signal generating means are provided on the side of said third sides of said first and second blocks, and said fifth through eighth selection signal generating means are provided on the side of said fourth sides of said first and second blocks.

12. The semiconductor memory device according to claim 10, wherein said plurality of selection signal generating means are provided on the side of said third sides of said plurality of blocks.

13. The semiconductor memory device according to claim 1, wherein said plurality of sub word lines further include a plurality of fifth sub word lines and a plurality of sixth sub word lines provided corresponding to said plurality of first main word lines, and a plurality of seventh sub word lines and a plurality of eighth sub word lines provided corresponding to said second main word lines, said plurality of selection signal lines further include a plurality of fifth selection signal lines and a plurality of sixth selection signal lines provided for said first block and a plurality of seventh selection signal lines and a plurality of eighth selection signal lines provided for said second block, said plurality of sub row decode means further include a plurality of fifth sub row decode means provided on said first block and connected to said plurality of first main word lines, said plurality of fifth sub word lines and said plurality of fifth selection signal lines, a plurality of sixth sub row decode means provided on said first block, and connected to said plurality of first main word lines, said plurality of sixth sub word lines and said plurality of sixth selection signal lines, a plurality of seventh sub row decode means provided on said second block and connected to said plurality of second main word lines, said plurality of seventh sub word lines and said plurality of seventh selection signal lines and a plurality of eighth sub row decode means provided on said second block and connected to said plurality of second main word lines, said plurality of eighth sub word lines and said plurality of eighth selection signal lines, said plurality of selection signal generating means further include fifth selection signal generating means provided corresponding to said first block, connected to said plurality of fifth selection signal lines, for generating and outputting a fifth selection signal, sixth selection signal generating means provided corresponding to said first block, connected to said plurality of sixth selection signal lines, for generating and outputting a sixth selection signal, seventh selection signal generating means provided corresponding to said second block, connected to said plurality of seventh selection signal lines, for generating and outputting a seventh selection signal, eighth selection signal generating means provided corresponding to said second block, connected to said plurality of eighth selection signal lines, for generating and outputting an eighth selection signal, wherein when any one of said plurality of first main word lines is activated, said first and second sub word lines and said fifth and sixth sub word lines are simultaneously placed into an activatable state by corresponding said first and second sub row decode means and said fifth and sixth sub row decode means, and then it is selected by said first and second selection signals and said fifth and sixth selection signals in said first block which of said first, second, fifth and sixth sub word lines is to be activated, and when any one of said plurality of second main word lines is activated, said third and fourth sub word lines and said seventh and eighth sub word lines are simultaneously placed into an activatable state by corresponding said third and fourth sub row decode means and said seventh and eighth sub row decode means, and then it is selected by said third and fourth selection signals and said seventh and eighth selection signals in said second block which of said third, fourth, seventh and eighth sub word lines is to be activated.

14. The semiconductor memory device according to claim 13, wherein said first through fourth selection signal generating means are provided on the side of said third sides of respective said first and second blocks, and said fifth though eighth selection signal generating means are provided on the side of said fourth sides of respective said first and second blocks.

15. A semiconductor memory device, comprising:

a plurality of memory elements provided in a plurality of rows and a plurality of columns for dynamically storing information by storing charge;

a main word line supplied with one of a first voltage not to make a selection of a set of rows in which said plurality of memory elements are provided and a second voltage higher than said first voltage to make the selection;

a first signal line for transmitting a binary first subdecode signal including said first voltage and a third voltage lower than said second voltage;

a second signal line for transmitting a second subdecode signal having a logical value complementary to said first subdecode signal;

a sub word line for selecting a certain row in said set of rows in accordance with an active state of said main word line and said first and second subdecode signals;

a first MOS transistor of P-channel having a first current electrode connected to said main word line, a control electrode connected to said second signal line and a second current electrode connected to said sub word line;

a second MOS transistor of N-channel having a first current electrode connected to said main word line, a control electrode connected to said first signal line and a second current electrode connected to said sub word line; and a third MOS transistor of N-channel having a first current electrode connected to said sub word line, a control electrode connected to said second signal line and a second current electrode connected to said first voltage.

16. The semiconductor memory device according to claim 15, wherein a voltage on the high level side applied to said second signal line is selectively determined to one of said second voltage and said third voltage.

* * * * *